United States Patent
Parikh et al.

(10) Patent No.: US 9,397,173 B2
(45) Date of Patent: *Jul. 19, 2016

(54) WIDE BANDGAP TRANSISTOR DEVICES WITH FIELD PLATES

(75) Inventors: Primit Parikh, Goleta, CA (US); Yifeng Wu, Goleta, CA (US)

(73) Assignee: CREE, INC., Goleta, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/355,766

(22) Filed: Jan. 23, 2012

(65) Prior Publication Data

US 2012/0132959 A1    May 31, 2012

Related U.S. Application Data

(63) Continuation of application No. 12/321,493, filed on Jan. 21, 2009, now Pat. No. 8,120,064, which is a continuation of application No. 10/930,160, filed on Aug. 31, 2004, now Pat. No. 7,501,669.

(60) Provisional application No. 60/501,576, filed on Sep. 9, 2003.

(51) Int. Cl.
| | |
|---|---|
| *H01L 29/778* | (2006.01) |
| *H01L 29/40* | (2006.01) |
| *H01L 29/423* | (2006.01) |

(Continued)

(52) U.S. Cl.
CPC ........ *H01L 29/402* (2013.01); *H01L 29/42316* (2013.01); *H01L 29/7787* (2013.01); *H01L 29/812* (2013.01); *H01L 29/1608* (2013.01); *H01L 29/2003* (2013.01)

(58) Field of Classification Search
USPC .......................................... 257/192, 194, 488
IPC ..................................................... H01L 29/2003
See application file for complete search history.

(56) References Cited

U.S. PATENT DOCUMENTS

| | | | |
|---|---|---|---|
| 4,551,905 A | 11/1985 | Chao et al. ....................... 29/571 |
| 4,766,474 A | 8/1988 | Nakagawa et al. | |

(Continued)

FOREIGN PATENT DOCUMENTS

| | | |
|---|---|---|
| CN | 1428870 A | 9/1920 |
| CN | 1242608 A | 1/2000 |

(Continued)

OTHER PUBLICATIONS

Interrogation from Japanese Patent Application No. 2007-513132, dated Sep. 25, 2012.

(Continued)

*Primary Examiner* — Eugene Lee
(74) *Attorney, Agent, or Firm* — Koppel, Patrick, Heybl & Philpott

(57) ABSTRACT

A transistor structure comprising an active semiconductor layer with metal source and drain contacts formed in electrical contact with the active layer. A gate contact is formed between the source and drain contacts for modulating electric fields within the active layer. A spacer layer is formed above the active layer and a conductive field plate formed above the spacer layer, extending a distance $L_f$ from the edge of the gate contact toward the drain contact. The field plate is electrically connected to the gate contact and provides a reduction in the peak operational electric field.

31 Claims, 5 Drawing Sheets

(51) Int. Cl.
*H01L 29/812* (2006.01)
*H01L 29/16* (2006.01)
*H01L 29/20* (2006.01)

(56) References Cited

U.S. PATENT DOCUMENTS

| | | | | |
|---|---|---|---|---|
| 4,947,232 | A | 8/1990 | Ashida et al. | 357/53 |
| 5,187,552 | A | 2/1993 | Hendrickson et al. | |
| 5,192,987 | A | 3/1993 | Khan et al. | 257/183.1 |
| 5,196,359 | A | 3/1993 | Shih et al. | 437/40 |
| 5,290,393 | A | 3/1994 | Nakamura | 156/613 |
| 5,296,395 | A | 3/1994 | Khan et al. | 437/40 |
| 5,393,993 | A | 2/1995 | Edmond et al. | 257/77 |
| 5,399,886 | A | 3/1995 | Hasegawa | 257/192 |
| 5,523,589 | A | 6/1996 | Edmond et al. | 257/77 |
| 5,543,253 | A | 8/1996 | Park | 216/12 |
| 5,569,937 | A | 10/1996 | Bhatnagar | 257/77 |
| 5,643,811 | A | 7/1997 | Hasegawa | 257/E21.407 |
| 5,652,179 | A | 7/1997 | Strifler et al. | 438/578 |
| 5,686,738 | A | 11/1997 | Moustakas | 257/103 |
| 5,710,455 | A | 1/1998 | Bhatnagar et al. | 257/472 |
| 5,739,554 | A | 4/1998 | Edmond et al. | 257/103 |
| 5,780,900 | A | 7/1998 | Suzuki et al. | 257/335 |
| 5,876,901 | A | 3/1999 | Ishimaru | 257/28 |
| 5,885,860 | A | 3/1999 | Weitzel et al. | 257/347 |
| 5,929,467 | A | 7/1999 | Kawai et al. | 257/192 |
| 6,033,948 | A | 3/2000 | Kwon et al. | 438/217 |
| 6,057,564 | A | 5/2000 | Rennie | 257/99 |
| 6,100,549 | A | 8/2000 | Weitzel et al. | 257/194 |
| 6,100,571 | A | 8/2000 | Mizuta | 257/488 |
| 6,127,703 | A | 10/2000 | Letavic et al. | 257/347 |
| 6,139,995 | A | 10/2000 | Burm | 257/27 |
| 6,140,169 | A | 10/2000 | Kawai et al. | 438/197 |
| 6,294,801 | B1 | 9/2001 | Inokuchi | 257/192 |
| 6,307,232 | B1 | 10/2001 | Akiyama et al. | 257/347 |
| 6,316,793 | B1 | 11/2001 | Sheppard et al. | 257/103 |
| 6,346,451 | B1 | 2/2002 | Simpson et al. | |
| 6,355,951 | B1* | 3/2002 | Hattori | 257/280 |
| 6,445,038 | B1 | 9/2002 | Tihanyi | |
| 6,468,878 | B1 | 10/2002 | Petruzzello et al. | 438/454 |
| 6,475,857 | B1 | 11/2002 | Kim | 438/240 |
| 6,483,135 | B1* | 11/2002 | Mizuta | 257/283 |
| 6,495,409 | B1 | 12/2002 | Manfra et al. | 438/216 |
| 6,548,333 | B2 | 4/2003 | Smith | 257/194 |
| 6,559,513 | B1 | 5/2003 | Miller et al. | 257/488 |
| 6,584,333 | B1 | 6/2003 | Gauss et al. | 505/220 |
| 6,586,781 | B2 | 7/2003 | Wu et al. | 257/194 |
| 6,586,813 | B2 | 7/2003 | Nagahara | 257/472 |
| 6,620,688 | B2 | 9/2003 | Woo et al. | 438/262 |
| 6,624,488 | B1 | 9/2003 | Kim | 257/411 |
| 6,686,616 | B1 | 2/2004 | Allen et al. | 257/280 |
| 6,690,042 | B2 | 2/2004 | Kahn et al. | 257/192 |
| 6,838,325 | B2 | 1/2005 | Whelan et al. | 438/172 |
| 6,870,219 | B2 | 3/2005 | Brech | |
| 6,891,235 | B1 | 5/2005 | Furukawa et al. | 257/480 |
| 6,902,964 | B2 | 6/2005 | Sriram | |
| 6,903,383 | B2 | 6/2005 | Yokogawa | 257/192 |
| 6,933,544 | B2 | 8/2005 | Saito et al. | 257/194 |
| 6,940,090 | B2 | 9/2005 | Saito et al. | 257/20 |
| 6,972,440 | B2 | 12/2005 | Singh et al. | 257/194 |
| 7,012,286 | B2 | 3/2006 | Inai et al. | 257/192 |
| 7,038,252 | B2 | 5/2006 | Saito et al. | 257/192 |
| 7,041,541 | B2 | 5/2006 | Behammer | 438/182 |
| 7,071,498 | B2 | 7/2006 | Johnson | 257/109 |
| 7,075,125 | B2 | 7/2006 | Saito et al. | 257/194 |
| 7,126,426 | B2 | 10/2006 | Mishra et al. | 330/307 |
| 7,229,903 | B2 | 6/2007 | Li et al. | 438/571 |
| 7,282,423 | B2 | 10/2007 | Furukawa et al. | 438/422 |
| 7,501,669 | B2 | 3/2009 | Parikh et al. | 257/194 |
| 7,508,015 | B2 | 3/2009 | Saito et al. | 257/194 |
| 7,550,783 | B2 | 6/2009 | Wu et al. | 257/194 |
| 7,679,111 | B2 | 3/2010 | Cao et al. | 257/287 |
| 7,800,131 | B2 | 9/2010 | Miyamoto et al. | 257/192 |
| 7,812,369 | B2 | 10/2010 | Chini et al. | 257/194 |
| 7,863,648 | B2 | 1/2011 | Miyamoto et al. | 257/192 |
| 7,964,915 | B2 | 6/2011 | Tanaka et al. | 257/341 |
| 8,193,562 | B2 | 6/2012 | Suh et al. | 257/194 |
| 8,502,323 | B2 | 8/2013 | Chen | 257/392 |
| 8,823,057 | B2 | 9/2014 | Sheppard et al. | 257/192 |
| 8,901,604 | B2 | 12/2014 | Mishra et al. | 257/170 |
| 2001/0015446 | A1 | 8/2001 | Inoue et al. | |
| 2001/0023964 | A1 | 9/2001 | Wu et al. | 257/368 |
| 2002/0005528 | A1 | 1/2002 | Nagahara | |
| 2002/0017648 | A1 | 2/2002 | Kasahara et al. | 257/79 |
| 2002/0105028 | A1 | 8/2002 | Fujihira | 257/339 |
| 2002/0137236 | A1 | 9/2002 | Schaff et al. | |
| 2002/0137318 | A1 | 9/2002 | Peake et al. | |
| 2002/0139995 | A1 | 10/2002 | Inoue et al. | 257/194 |
| 2002/0145172 | A1 | 10/2002 | Fujishima et al. | |
| 2002/0155646 | A1 | 10/2002 | Petruzzello et al. | |
| 2002/0167023 | A1 | 11/2002 | Chavarkar et al. | |
| 2003/0006437 | A1 | 1/2003 | Mizuta et al. | |
| 2003/0020092 | A1 | 1/2003 | Parikh et al. | |
| 2003/0075719 | A1 | 4/2003 | Sriram et al. | |
| 2003/0107081 | A1 | 6/2003 | Lee et al. | |
| 2003/0132463 | A1 | 7/2003 | Miyoshi | |
| 2003/0141518 | A1 | 7/2003 | Yokogawa | 257/194 |
| 2003/0183844 | A1 | 10/2003 | Mitsunori et al. | |
| 2003/0183886 | A1 | 10/2003 | Inoue et al. | |
| 2003/0222327 | A1 | 12/2003 | Yamaguchi et al. | |
| 2004/0021175 | A1 | 2/2004 | Brech | |
| 2004/0124435 | A1 | 7/2004 | D'Evelyn et al. | 257/103 |
| 2004/0188775 | A1 | 9/2004 | Peake et al. | 257/397 |
| 2004/0201038 | A1 | 10/2004 | Kimura et al. | |
| 2004/0227211 | A1 | 11/2004 | Saito et al. | |
| 2005/0051796 | A1 | 3/2005 | Parikh et al. | |
| 2005/0051800 | A1 | 3/2005 | Mishra | 257/202 |
| 2005/0062069 | A1 | 3/2005 | Saito et al. | 257/213 |
| 2005/0082611 | A1 | 4/2005 | Peake et al. | 257/341 |
| 2005/0110042 | A1 | 5/2005 | Saito et al. | |
| 2005/0124100 | A1 | 6/2005 | Robinson | 438/167 |
| 2005/0133818 | A1 | 6/2005 | Johnson et al. | 257/192 |
| 2005/0253167 | A1 | 11/2005 | Wu et al. | |
| 2005/0253168 | A1 | 11/2005 | Wu et al. | 257/192 |
| 2006/0006415 | A1 | 1/2006 | Wu et al. | 257/194 |
| 2006/0011915 | A1 | 1/2006 | Saito et al. | 257/65 |
| 2006/0043416 | A1 | 3/2006 | P. Li et al. | 257/192 |
| 2006/0071247 | A1 | 4/2006 | Chen et al. | |
| 2006/0081877 | A1 | 4/2006 | Kohji et al. | 257/194 |
| 2006/0108606 | A1 | 5/2006 | Saxler | 257/200 |
| 2006/0118809 | A1 | 6/2006 | Parikh et al. | 257/103 |
| 2006/0202272 | A1 | 9/2006 | Wu et al. | 257/194 |
| 2006/0286732 | A1 | 12/2006 | Burke et al. | 438/197 |
| 2007/0059873 | A1 | 3/2007 | Chini et al. | 438/199 |
| 2007/0102727 | A1 | 5/2007 | Twynam | 257/194 |
| 2007/0164315 | A1 | 7/2007 | Smith | 257/194 |
| 2007/0194354 | A1 | 8/2007 | Wu et al. | 257/288 |
| 2007/0235775 | A1 | 10/2007 | Wu et al. | |
| 2007/0241368 | A1 | 10/2007 | Mil'shtein | 257/192 |
| 2007/0249119 | A1 | 10/2007 | Saito | 438/253 |
| 2008/0006898 | A1 | 1/2008 | Yafune et al. | 257/471 |
| 2008/0067558 | A1 | 3/2008 | Kawasaki | 257/263 |
| 2009/0032820 | A1 | 2/2009 | Chen | 257/76 |
| 2009/0230429 | A1 | 9/2009 | Miyamoto et al. | 257/192 |
| 2009/0230430 | A1 | 9/2009 | Miyamoto et al. | 257/192 |
| 2009/0236635 | A1 | 9/2009 | Wu et al. | 257/194 |
| 2010/0201439 | A1 | 8/2010 | Wu et al. | 327/581 |
| 2010/0314666 | A1 | 12/2010 | Saito et al. | |
| 2011/0241020 | A1 | 10/2011 | Saunier | 257/77 |
| 2012/0132959 | A1 | 5/2012 | Parikh et al. | 257/194 |
| 2012/0175679 | A1 | 7/2012 | Marino et al. | 257/194 |
| 2012/0218783 | A1 | 8/2012 | Imada | 363/37 |
| 2012/0235156 | A1 | 9/2012 | Kuraguchi | |
| 2012/0261720 | A1 | 10/2012 | Puglisi et al. | 257/355 |
| 2013/0062667 | A1 | 3/2013 | Chini et al. | 257/195 |
| 2013/0069115 | A1 | 3/2013 | Nakazawa | 257/192 |
| 2013/0069117 | A1 | 3/2013 | Yoshioka et al. | 257/194 |
| 2013/0083567 | A1 | 4/2013 | Imada | 363/37 |
| 2013/0193485 | A1 | 8/2013 | Akiyama et al. | 257/194 |
| 2013/0292699 | A1 | 11/2013 | Ueno | 257/76 |
| 2014/0001478 | A1 | 1/2014 | Saunier et al. | 257/76 |
| 2014/0061659 | A1 | 3/2014 | Teplik et al. | 257/76 |
| 2014/0175453 | A1 | 6/2014 | Yamada | 257/76 |
| 2014/0239346 | A1 | 8/2014 | Green et al. | 257/192 |

(56) References Cited

U.S. PATENT DOCUMENTS

| | | | |
|---|---|---|---|
| 2014/0264360 A1 | 9/2014 | Huang et al. | 257/76 |
| 2014/0353720 A1 | 12/2014 | Inoue | 257/192 |
| 2014/0361341 A1 | 12/2014 | Sriram et al. | 257/194 |
| 2014/0361343 A1 | 12/2014 | Sriram | 257/194 |

FOREIGN PATENT DOCUMENTS

| | | | |
|---|---|---|---|
| CN | 2000003919 A | 7/2000 | |
| CN | 1321340 | 11/2001 | |
| CN | 1321340 A | 11/2001 | |
| CN | 1242608 | 1/2003 | |
| CN | 1639875 A | 7/2005 | |
| EP | 0069429 | 1/1983 | |
| EP | 0792028 A2 | 2/1997 | |
| EP | 0792028 | 8/1997 | |
| EP | 1 336 989 A2 | 8/2003 | |
| EP | 1336989 | 8/2003 | |
| EP | 1336989 A2 | 8/2003 | |
| JP | 62-237763 | 10/1987 | |
| JP | 63-087773 | 4/1988 | |
| JP | 305536 A | 2/1991 | |
| JP | 03035536 | 2/1991 | |
| JP | 05021793 A | 1/1993 | |
| JP | 06-349859 | 12/1994 | |
| JP | 6349859 | 12/1994 | |
| JP | 06349859 | 12/1994 | |
| JP | 6349859 A | 12/1994 | |
| JP | 07038108 | 2/1995 | |
| JP | 07050413 | 2/1995 | |
| JP | 07176544 | 7/1995 | |
| JP | 09232827 | 9/1997 | |
| JP | H09232827 | 9/1997 | |
| JP | 11008256 | 1/1999 | |
| JP | H118256 | 1/1999 | |
| JP | 1197455 | 4/1999 | |
| JP | 11233525 | 8/1999 | |
| JP | 11-274174 | 10/1999 | |
| JP | 11274174 | 10/1999 | |
| JP | 11274174 A | 10/1999 | |
| JP | 2000-003919 | 1/2000 | |
| JP | 2000003919 | 1/2000 | |
| JP | 2000082671 | 3/2000 | |
| JP | 2000-100831 | 4/2000 | |
| JP | 2000100831 A | 4/2000 | |
| JP | 2000-164926 | 6/2000 | |
| JP | 2002-270830 | 3/2001 | |
| JP | 2001160656 | 6/2001 | |
| JP | 2001189324 | 7/2001 | |
| JP | 2001-230263 | 8/2001 | |
| JP | 2001-230407 | 8/2001 | |
| JP | 2002016245 | 1/2002 | |
| JP | 2002094054 | 3/2002 | |
| JP | 2002100642 | 4/2002 | |
| JP | 2002118122 | 4/2002 | |
| JP | 2000270620 | 9/2002 | |
| JP | 2002270830 A | 9/2002 | |
| JP | 2002343814 | 11/2002 | |
| JP | 2003100775 | 4/2003 | |
| JP | WO03036729 | 5/2003 | |
| JP | 2003188189 | 7/2003 | |
| JP | 2003203923 | 7/2003 | |
| JP | 2003-297854 | 10/2003 | |
| JP | 2003297854 | 10/2003 | |
| JP | 2005507174 | 3/2005 | |
| JP | 2005093864 | 4/2005 | |
| JP | 2005527102 A | 9/2005 | |
| JP | 2005535113 | 11/2005 | |
| JP | 2005340417 | 12/2005 | |
| JP | 2007019560 | 1/2007 | |
| KR | 200000006218 | 1/2003 | |
| TW | 334632 B | 6/1998 | |
| TW | 552712 B | 9/2003 | |
| TW | 579600 B | 3/2004 | |
| TW | I2230978 B | 4/2005 | |
| WO | WO9908323 | 2/1999 | |
| WO | WO02093650 | 11/2002 | |
| WO | WO 03/036729 A1 | 1/2003 | |
| WO | WO 03/032397 A2 | 4/2003 | |
| WO | WO03036729 A1 | 5/2003 | |
| WO | WO03038905 A2 | 8/2003 | |
| WO | WO2004068590 | 8/2004 | |
| WO | WO2004068590 A1 | 8/2004 | |
| WO | WO2006025971 | 7/2005 | |
| WO | WO2005114743 | 12/2005 | |
| WO | WO2006025971 | 3/2006 | |
| WO | WO 2006025971 | 3/2006 | |

OTHER PUBLICATIONS

European Search Report from European Patent Application No. 12171403.4-2203/2515339, dated Nov. 12, 2012.
European Search Report from European Patent Application No. 12171401.8-2203/2515338, dated Nov. 13, 2012.
Decision of Rejection from Japanese Patent Application No. 2008-500703, dated Nov. 20, 2012.
Decision of Rejection from Japanese Patent Application No. 2007-513155, dated Nov. 13, 2012.
Examination Report for European Patent Application No. 05756258.9 dated Dec. 11, 2012.
Office Action from Taiwanese Patent Application No. 094111532, dated Nov. 23, 2012.
"High Power Density and Low Distortion InGaP Channel FET's with Field-Modulating Plate", Wakejima, et al., IEICE Trans Electron. vol. E85-C, No. 12, Dec. 2002, pp. 2041-2045.
"Very high voltage AlGaN/GaN high electron mobility transistors using a field plate deposited on a stepped insulator", Karmalker, et al., Solid-State Electronics 45 (2001) pp. 1645-1652.
Extended European Search Report from Appl. No. 11183396-8-2203/2432021, dated: Feb. 22, 2012.
Extended European Search Report from Appl. No. 11183404.0-2203, dated: Feb. 28, 2012.
Examiner's Report from Canadian Appl. No. 2566361, Dated: Feb. 7, 2012.
Extended European Search Report from Application No. 11183655.7-2203, dated: Mar. 1, 2012.
Examiner's Report for Canadian Patent Application No. 2,566,756, dated Feb. 16, 2012.
Examiner's Report for Canadian Patent Application No. 2,564,955, dated Feb. 24, 2012.
Summary of "Notice of Reasons for Rejection", Japanese Patent Application No. 2008-500703, dated Jan. 10, 2012.
Summary of "Notice of Reasons for Rejection", Japanese Patent Application No. 2007-238147, dated Jan. 24, 2012.
Japanese Patent Appl. No. 2003-081849 (Laid-open No. 2004-289038) Patent Abstracts of Japan.
Official Notice of Rejection mailed on Jun. 24, 2008, Japanese Patent Appl. No. 2006-526270 and comments.
First Office Action re related Chinese Appl. No. 200580015278.5, dated May 9, 2008.
European Examination Report Appl. No. 05731252.2-2203 dated: Jul. 30, 2008.
First Office Action from related China Appl. No. 200480032782.1, dated: Jul. 18, 2008.
Second Office Action from related China Application No. 200580015278.5, Dated: Dec. 19, 2008.
Communication Pursuant to Article 94(3) EPC re: related European Application No. 07018026.0.
Patent Abstracts of Japan, Pub. No. 07176544, Pub. Date: Jul. 14, 1995.
Official Notice of Final Decision of Rejection re Japan Patent App. No. 2006-526270, Dated: Jan. 23, 2009.
Office Action from European Patent Appl. No. 05756258.9 dated Jun. 10, 2010.
Third Office Action from related Chinese Appl. No. 200580014866.7, dated: Oct. 10, 2009.
Office Action from European Patent Appl. No. 05735109.0 dated Aug. 27, 2010.

(56) References Cited

OTHER PUBLICATIONS

Notification of Rejection/Objection from Chinese Patent appl. No. 200580014868.6 dated Aug. 11, 2010.
Examiner's First Report on Patent Appl. Re related Australian appl. No. 2005246697 dated Mar. 19, 2010.
International Preliminary Examination Report re related PCT Appl. No. PCT/US05/13725 mailed May 25, 2007.
CRC Press, *The Electrical Engineering Handbook*, Second Edition, Dorf, (1997) p. 994.
B. Belmont, K. Kim, and M. Shur. "Monte Carlo Simulation of Electron Transport in Gallium Nitrate." *Journal of Applied Physics*, vol. 74, Issue 3, (Aug. 1, 1993) p. 1818.
R. Gaska, J.W. Yang, A. Osinsky, Q. Chen, M.A. Khan, A.O. Orlov, G.L. Snider, M.S. Shur. "Electron Transport in AlGaN Heterostructures Grown on 6H-SiC Substrates." *Applied Physics Letters*, vol. 72, No. 6 (Feb. 9, 1998) p. 707.
Y. F. Wu et. al. "GaN-Based FETs for Microwave Power Amplification." *IEICE Transactions on Electronics*, E-82-C, (1999) p. 1895.
Y.F. Wu, D. Kapolnek, J.P. Ibettson, P. Parikh, B.S. Keller, and U.K. Mishra. "Very-High Power Density AlGaN/GaN HEMTs." *IEEE Transactions on Electronic Devices*, vol. 48, Issue 3 (Mar. 2001) p.
M. Micovic, A. Kurdoghlian, P. Janke, P. Hashimoto, D.W.S. Wong, J. S. Moon, L. McRay, and C. Nguyen. "AlGaN/GaN Heterojunction Field Effect Transistors Grown by Nitrogen Plasma Assisted Molecular Beam Epitaxy." *IEEE Transactions on Electronic Devices*, vol. 48, Issue 3, (Mar. 2001).
Gaska et al., "High Temperature Performance of AlGaN/GaN HFET's on SiC Substrates." *IEEE Electron Device Letters* vol. 18, No. 10, (Oct. 1997) p. 492.
Ping et al., "DC and Microwave Performance of High Current ALGaN Heterostructure Field Effect Transistors Grown on P-Type SiC Substrates." *IEEE Electron Device Letters* vol. 19, No. 2, (Feb. 1998) p. 54.
L. Eastman, K. Chu, J. Smart, J. R. Shealy, "GaN Materials for High Power Microwave Amplifiers." *Materials Research Society* vol. 512 Wocsemmad, Monterey, CA (Feb. 1998) p. 3-7.
G. Sullivan et al., "High Power 10-GHz Operation of AlGaN HFET's in Insulating SiC." *IEEE Electron Device Letters* vol. 19, No. 6, (Jun. 1998) p. 198.
Wu et al., "High Al-Content AlGaN/GaN MODFETs for Ultrhigh Performance." *IEEE Electron Device Letters* vol. 19, No. 2, (Feb. 1998) p. 50.
Y. Ando, et al., "10-W/mm AlGaN-GaN HFET With a Field Modulating Plate." *IEEE Electron Device Letters* vol. 24, No. 5, (May 2003) p. 289-292.
S. Karmalkar, U.K. Mishra, "Very High Voltage AlGaN/GaN High Electron Mobility Transistors Using a Field Plate Deposited on a Stepped Insulator." *Solid-State Electronics* vol. 45, (2001) pp. 1645-1652.
W. Saito et al., "600V AlGaN/GaN Power-HEMT: Design, Fabrication and Demonstration on High Voltage DC-DC Converter." *IEEE IEDM* vol. 23, No. 7, (2003) pp. 587-590.
Wu et al., "High-Gain Microwave GaN HEMTs With Source-Terminated Field-Plates", Cree Santa Barbara Technology Center.
Wu et al., "30-W/MM GaN HEMTs by Field Plate Optimization", IEEE, vol. 25, No. 3, Mar. 2004, p. 117-119.
Saito et al. "Design and Demonstration of High Breakdown Voltage GaN High Electron Mobility Trasistor (HEMT) Using Field Plate Structure for Power Electronics Applications", Japanese Journal of Applied Physics, Japan Society of Applied Physics, Tokyo, JP vol. 43, No. 4B, Apr. 2004 pp. 2239-2242, XP001227744, ISSN: 0021-4922.
Saito et al. "High Breakdown Voltage AlGaN-GaN Power HEMT Design and High Current Density Switching Behavior", IEEE Transactions on Electron Devices, vol. 50, No. 12, Dec. 2003, pp. 2528-2531.
Heikman et al. "Growth of Fe Doped Semi-Insulating GaN by Metalorganic Chemical Vapor Deposition" Applied Physics Letters, vol. 81, No. 3, Jul. 2002, pp. 439-441.

Heikman, Growth and Characteristics of Fe-Doped GaN, Journal of Crystal Growth 248 (2003), 513-517.
IEEE Electron Device Letters, vol. 18, No. 10, (Oct. 1997), p. 492.
Wu et al. "High Al Content AlGaN/GaN HEMTs on Sick Substrates With Very High Performance", IEDM 1999 Digest pp. 925-927, Washington, D.C. Dec. 1999.
IEEE Transactions on Electron Devices, vol. 48, No. 3 Mar. 2001, p. 581-585.
Kahn et al., "AlGaN/GaN Metal-Oxide-Semiconductor Heterostructure Field-Effect Transistors on SiC Substrates", Applied Physics Letters, American Institute of Physics. New York, US, vol. 77, No. 9, Aug. 2000, p. 1339-1341, XP000951319 ISSN: 0003-6951.
Lu et al. "P-Type SiGe Transistors With Low Gate Leakage Using SIN Gate Dielectric", IEEE Electron Device Letters, IEEE, Inc., New York, US, vol. 20, No. 10, Oct. 1999, p. 514-516, XP000890470, ISSN: 0741-3106.
Zhang N-Q et al., "High Breakdown GaN HEMT With Overlapping Gate Structure", IEEE Electron Device Letters, IEEE, Inc. New York, US, vol. 9, Sep. 2000, p. 373-375, XP000954354, ISSN: 0741-3106.
Office Action from related, U.S. Appl. No. 10/958,970, dated Sep. 10, 2008.
PCT International Preliminary Report for Group of Related Applications, PCT/US05/09884, Dated: Aug. 25, 2008.
From related application: Chinese Patent Appl. No. 200580014868.6, Second Office Action dated: Feb. 24, 2010.
Notice regarding Submission of Opinion (counterpart) Korean Patent Appl. No. 10-2006-7004682, dated: Feb. 17, 2011.
Third Office Action regarding related Chinese Application No. 200580015278.5, dated: May 15, 2009.
First Offical Communication regarding the related European Application No. 07018026.0, Dated: Dec. 17, 2008.
Official Notice of Rejection mailed on Jun. 24, 2008, Japanese Patent Application No. 2006-526270 and comments.
Japanese Patent Application Laid-open No. 22002-016245 Patent Abstracts of Japan.
Japanese Patent Application Laid-open No. 2001230407 Patent Abstracts of Japan.
Japanese Patent Application Laid-open No. 2002-343814 Patent Abstracts of Japan.
Japanese Patent Application Laid-open No. 63-087773 Patent Abstracts of Japan.
Japanese Patent Application Laid-open No. 2001-230263 Patent Abstracts of Japan.
Japanese Patent Application No. 2003-307916 (Laid-open No. 2005-079346) Patent Abstracts of Japan.
Asano K et al: "Novel High Power AlGaAs/GaAs HFET With a Field-Modulating Plate Operated At 35 V Drain Voltage", Electron Devices Meeting, 1998. IDM '98 Technical Digest. International San Francisco, CA USA Dec. 6-9, 1998, Piscataway, NJ, USA IEEE US, Dec. 6, 1998, pp. 59-62 XP010321500.
Wakejima A et al, "High Power Density and Low Distortion InGap Channel Fets With Field-Modulating Plate", IEICE Transactions on Electronics, Institute of Electronics Information and Comm. Eng. Tokyo, JP, vol. E85-C, No. 12, Dec. 2002, pp. 2041-2045, XP001161324.
Mop P K T et al, "A Novel High-Voltage High-Speed MESFET Using a Standard GAAS Digital IC Process" IEEE Transactions on Electron Devices, IEEE Inc. New York, US. vol. 41, No. 2, Feb. 1, 1994, pp. 246-250, XP000478051.
Li J, et al "High Breakdown Voltage GaN HFET With Field Plate" Eelectronics Letters, IEE Stevenage, GB vol. 37, No. 3, Feb. 1, 2001, 196-197, XP006016221.
Xing H. et al. "High Breakdown Voltage AlGaN-GaN HEMTs Achieved by Multiple Field Plates" IEEE Electron Device Letters, IEEE Inc. New York, US. vol. 25, No. 4, Apr. 2004, pp. 161-163, XP001190361.
Tilak, et al., "Effect of Passivation on AlGaN/GaN HEMT Device Performance" 2000 IEEE International Symposium on Compound Semiconductors. Proceedings of the IEEE 27th International Symposium on Compound Semiconductors (Cat. No. 00th 8498), 2000 IEEE

(56) References Cited

OTHER PUBLICATIONS

International Symposium on Compound Semiconductors Proceedings of the, p. 357-363, XP002239700, 2000 Piscataway, NJ, USA, IEEE, US ISBN: 0-7803-6258-6.
First Examination Report from related European Application No. 04 788 642.9-2203, Dated: Dec. 22, 2009.
Second Office Action From Related Chinese Application No. 200480032782.1, Dated: Dec. 28, 2009.
Office Action from related U.S. Appl. No. 11/078,265, mailed on Jan. 20, 2010.
Office Action from related U.S. Appl. No. 11/807,701, mailed on Jan. 26, 2010.
Office Action from related U.S. Appl. No. 10/958,945, mailed on Jan. 28, 2010.
Second Office Action from related Chinese Application No. 200580014866.7, dated: Nov. 25, 2009.
Third Office Action in counterpart Chinese Patent Application No. 200480032782.1 dated Mar. 9, 2011.
Supplemental Examination in European Patent Application No. 05731252.2 dated May 11, 2011.
Office Action for Taiwan Patent Application No. 09312733 dated Apr. 29, 2011.
Office Action for Korean Patent Application No. 10-2006-7026090 mailed May 17, 2011.
Extended Search Report for European Patent Appl. No. 10183441.4 dated Dec. 2, 2010.
Extended Search Report for European Patent Appl. No. 10183607.0 dated Dec. 6, 2010.
Saito, W., et al., "Theoretical Limit Estimation of Lateral Wide Band-Gap Semiconductor Power-Switching Device", Solid State electronics, Elsevier Science Publishers, Barking, GB, vol. 48, No. 9, Apr. 23, 2004, pp. 1555-1362.
Office Action from related U.S. Appl. No. 10/930,160, dated: Nov. 1, 2005.
Response to related Office Action U.S. Appl. No. 10/930,160, dated: Apr. 3, 2006.
Office Action from related U.S. Appl. No. 10/930,160, dated May 15, 2006.
Response to related Office Action U.S. Appl. No. 10/930,160, dated: Oct. 17, 2006.
Office Action from related U.S. Appl. No. 10/930,160, dated: Jan. 24, 2007.
Response to related Office Action U.S. Appl. No. 10/930,160, dated: May 7, 2007.
Office Action from related U.S. Appl. No. 10/930,160, dated. Aug. 2, 2007.
Response to related Office Action U.S. Appl. No. 10/930,160, dated: Dec. 3, 2007.
Office Action from related U.S. Appl. No. 10/930,160, dated: Mar. 26, 2008.
Response to related Office Action U.S. Appl. No. 10/930,160, dated: Jul. 26, 2008.
Notice of Allowance from related U.S. Appl. No. 10/930,160.
Office Action from related U.S. Appl. No. 11/807,701, dated: Aug. 22, 2008.
Response to related Office U.S. Appl. No. 11/807,701, dated: Dec. 19, 2008.
Office Action from related U.S. Appl. No. 11/807,701, dated: Jun. 19, 2009.
Response to related Office Action U.S. Appl. No. 11/807,701, dated: Sep. 15, 2009.
Office Action from related U.S. Appl. No. 11/807,701, dated: Nov. 12, 2009.
Response to related Office Action U.S. Appl. No. 11/807,701, dated: Jan. 11, 2010.
Office Action from related U.S. Appl. No. 11/807,701, dated: Jan. 26, 2010.
Response to related office action U.S. Appl. No. 11/807,701, dated: Apr. 26, 2010.
Summary of Notice of Reasons for Rejection for Japanese Patent Application No. JP 2007-513132 mailed Sep. 13, 2011.
Summary of Notice of Reasons for Rejection for Japanese Patent Application No. JP 2007-51367 mailed Dec. 6, 2011.
Trial Decision from Japanese Patent Application No. 2006-526270, dated: Dec. 13, 2011.
Office Action from Korean Patent Application No. 10-2006-7026207, dated: Jul. 26, 2011.
Office Action from Korean Patent Application No. 10-2006-7026090, dated: May 17, 2011.
Summary of Notice of Reasons for Rejection for Japanese Patent Application No. JP 2007-513155 mailed Sep. 13, 2011.
"High Breakdown Voltage AlGaN-GaN Power-HEMT Design and High Current Density Switching Behavior", Wataru Saito, et al., IEEE Transactions of Electron Devices, vol. 50, No. 12, Dec. 2003, pp. 2528-2531.
Summary of Decision of Rejection for Japanese Application No. 2007-513132, dated Mar. 13, 2012.
Decision of Rejection from Taiwanese Application No. 094111532, dated Apr. 11, 2012.
Office Action and Search Report from Taiwanese Patent Application No. 093127333, dated Jul. 5, 2012.
Office Action and Search Report from Taiwanese Patent Application No. 095103561, dated Jul. 24, 2012.
Office Action from Taiwanese Patent Application No. 094114829, dated May 29, 2012.
Pretrial Examination Communication from Examiner from Japanese Patent Appl. No. 2008-500703, Appeal No. 2013-05298, dated Jun. 3, 2013.
Office Action from U.S. Appl. No. 10/958,945, dated May 15, 2013.
Response to Office Action U.S. Appl. No. 10/958,945, dated Mar. 14, 2013.
Office Action from U.S. Appl. No. 10/958,945, dated Mar. 14, 2013.
Office Action from U.S. Appl. No. 12/497,468, dated Mar. 12, 2013.
Response to Office Action U.S. Appl. No. 12/497,468, dated Nov. 20, 2012.
Office Action from U.S. Appl. No. 12/497,468, dated Nov. 20, 2012.
Office Action from U.S. Appl. No. 13/245,579, dated Jan. 31, 2013.
Office Action from U.S. Appl. No. 13/072,449, dated Dec. 13, 2012.
Response to Office Action U.S. Appl. No. 15/072,449, filed Feb. 13, 2013.
Notice of Reasons for Rejection for Japanese Patent Appl. No. 2007-513167, dated Jan. 9, 2013.
Examination Report from Canadian Patent Appl. No. 2,566,756, dated Nov. 7, 2013.
European Search Report from European Patent Appl. No. 12180744.0-1552, dated Dec. 12, 2013.
Examination Report from Canadian Patent Appl No. 2,564,955, dated Dec. 6, 2012.
Notice of Reasons for Rejection from Japanese Patent Appl. No. 2008-500703. dated Nov. 12, 2013.
Reason for Rejection from Japanese Patent Appl. No. 2012-157890, dated Dec. 24, 2013.
European Search Report from European Patent Appl. No. EP 2 538 446 A3, Published Jan. 15, 2014.
Reasons for Rejection from Japanese Patent Appl. No. 2012-107672, dated Dec. 24, 2013.
Reasons for Rejection from Japanese Patent Appl. No 2012-117726, dated Dec. 24, 2013.
Interrogation from Japanese Patent Application No. 2007-513155, dated Jun. 25, 2013.
Decision of Rejection from Japanese Patent appl. No. 2007-513167, dated Jul. 4, 2013.
Office Action from Taiwanese Patent Appl. No. 095103561, dated Jun. 27. 2013.
Office Action from U.S. Appl. No. 13/245,579, dated Oct. 25, 2013.
Notice of Reasons for Rejection from Japanese Patent Appl. No. 2007-513132, dated Jun. 25, 2013.
Office Action from Japanese Patent Appl. No. 2008-500703, dated Jun. 25, 2013.

(56) References Cited

OTHER PUBLICATIONS

A.J. Bergsma, "A Comprehensive Design Method for Dual Gate MOSFET Mixers", Ottawa Carleton Institute for Electrical Engineering, Dept. of Electronics, Carleton University. Ottawa. Canada, May 1995, © 1998 AJ Bergsma.
Vetury, et al., "Performance and RF Reliability of GaN-on-SiC HEMTs Using Dual-Gate Architectures", Air Force Research Laboratory, Jul. 2006, Air Force Contract No. FA8650-05-C-5411. Wright-Patterson Air Force Base, OH 45433-7750.
First Office Action from Chinese Patent Appl. No. 2011102654868, dated Jun. 19, 2013.
Office Action from Taiwanese Patent Appl No. 101131917, dated Jul. 26, 2013.
Examination Report from European Patent Appl. No. 06 718 166.9, dated Aug. 13. 2013.
Office Action from U.S. Appl. No. 10/958,945, dated Aug. 16, 2013.
Office Action from U.S. Appl. No. 11/078,265, dated Aug. 15, 2013.
Office Action from U.S. Appl. No. 10/958,945, dated Nov. 14, 2013.
Response to OA from U.S. Appl. No. 10/958,945, filed Jan. 10, 2014.
Office Action from U.S. Appl. No. 11/078,265, dated Apr. 28, 2014.
Decision from Taiwanese Patent Appl. No. 095103561 dated Mar. 31, 2014.
Second Office Action from Chinese Patent Appl. No. 201110265486.8. dated Mar. 13, 2014.
Notice of Reasons for Rejection from Japanese Patent Appl. No. 2007-513167, dated Feb. 4, 2014.
Appeal Decision from Japanese Patent Appl. No. 2007-513155, dated Mar. 11, 2014.
Office Action from U.S. Appl. No. 13/245,579, dated Mar. 13, 2014.
Office Action from U.S. Appl. No. 10/956,945, dated Mar. 31, 2014.
Office Action from Japanese Patent Appl. No. 2013-050780, dated Jul. 1, 2014.
Third Office Action from Chinese Patent Appl. No. 200580014868.6, dated Jul. 2, 2014.
Decision of Rejection from Japanese Appl. No. 2012-157890, dated Oct. 21, 2014.
Office Action from Taiwanese Patent Appl. No. 101124701, dated Oct. 14, 2014.
Office Action from Japanese Patent Appl. No. 2012-107672, dated Nov. 11, 2014.
Office Action from Japanese Patent Appl. No. 2013-050780, dated Dec. 9, 2014.
Third Office Action from Chinese Appl. No. 201110265486.8, dated Sep. 17, 2014.
Communication from European Appl. No. 07 018 026.0-1552, dated Oct. 14, 2014.
International Search Report and Written Opinion from Appl. No. PCT/US2014/041171, dated Sep. 22, 2014.
R. Vetury, et al., "Performance and RF Reliability of GaN-on-SiC HEMT's using Dual-Gate Architectures", RF Micro Devices, Charlotte, NC, 28269. p. 714.
Decision of Patent Grant and Allowed Claims from Japanese Patent Appl. No. 2007-513167, dated Aug. 5, 2014.
International Search Report and Written Opinion from PCT/US2014/037728, dated Aug. 18, 2014.
Further Examination on European Patent Appl No. 04 788 624.9, dated Aug. 5, 2014.
Office Action and Search Report from Taiwanese Appl. No. 102102725, dated Dec. 8, 2014.
Notice of Allowance from Taiwanese Patent Appl. No. 101124701, dated Mar. 2, 2015.
Fourth Office Action from Chinese Patent Appl. No. 200580019868.6 dated Feb. 15, 2015.
Notice of Allowance from Taiwanese Patent Appl. No. 095103561, dated Feb. 17, 2015.
Intention to Grant from European Patent Appl. No. 07018026.0-1552, dated Mar. 25, 2015.
J. Li, et al., "High Breakdown Voltage GaN HFET with Field Plate", Electronic Letters, $1^{st}$ Feb. 2001; vol. 37, No. 3.

Office Action from Taiwanese Patent Appl. No. 101137523, dated Dec. 31, 2014.
Zhang, et al., "High Breakdown GaN HEMT with Overlapping Gate Structure", IEEE Electron Device Letters, vol. 21, No. 9, Sep. 2000.
Examiner Report from Canadian Patent Appl. No, 2,566,361, dated Feb. 4, 2015.
Decision of Rejection from Japanese Patent Application No. 2012-117726, dated Jan. 27, 2015.
Office Action from U.S. Appl. No. 13/913,490, dated Dec. 16, 2014.
Office Action from U.S. Appl. No. 11/076,265, dated Dec. 29, 2014.
Office Action from U.S. Appl. No. 13/929,487, dated Dec. 29, 2014.
Office Action from U.S. Appl. No. 10/958,945, dated Dec. 31, 2014.
Office Action from U.S. Appl. No. 14/025,478, dated Jan. 21, 2015.
Fourth Office Action from Chinese Patent Appl. No. 201110265486.8, dated Apr. 15, 2015.
Examination from Canadian Patent Appl, No. 2,564,955, dated Apr. 7, 2015.
Office Action from Taiwanese Patent Appl. No. 102102725, dated May 18, 2015.
Decision to Grant from European Patent Appl. No. 07018026.0, dated Aug. 6, 2015.
Office Action from U.S. Appl. No. 13/929,487, dated Jun. 3, 2015.
Notice of Allowance from Taiwanese Patent Appl. No. 101137523, dated Sep. 25, 2015.
Saito et al, "Design and Demonstration of High Breakdown Voltage GaN High Electron Mobility Transistor (HEMT) Using Field Plate Structure for Power Electronics Applications", Japanese Journal of Applied Physics, Japan Society of Applied Physics. Tokyo. JP, vol. 43, No. 4B, Apr. 2004, pp. 2239-2242, XP001227744, ISSN: 0021-4922.
Saito, et al. "Theoretical Limit Estimation of Lateral Wide Band-gap Semiconductor Power-switching Device". Solid State Electronics, Elsevier Science Publishers, Barking, GP, vol. 48, No. 9, Apr. 23, 2004, pp. 1555-1562, XP004518805, ISSN: 0038-1101.
Examination Report from European Patent Appl. No. 10 183 441.4, dated Jul. 29, 2015.
Decision of Patent Grant from Japanese Patent Appl. No. 2012-157890, dated Aug. 18, 2015.
Fifth Office Action from Chinese Patent Appl. No. 200580014868.6, dated Aug. 27, 2015.
Office Action from Taiwanese Patent Appl. No. 103120237, dated Sep. 15, 2015.
Office Action from U.S. Appl. No. 14/025,478, dated Aug. 4, 2015.
Response to OA from U.S. Appl. No. 14/025,478, filed Sep. 22, 2015.
Office Action from Patent Application No. 11/078, dated Sep. 18, 2015.
Office Action from U.S. Appl. No. 10/958,945, dated Oct. 1, 2015.
Office Action from Japanese Patent Appl. No. 2012-157890, dated Apr. 22, 2015.
Notice of Allowance from Japanese Patent Appl. No. 2013-050780, dated Apr. 28, 2015.
Reasons for Rejection from Japanese Patent Appl. No. 2014-126655, dated May 26, 2015.
Office Action from Japanese Patent Appl. No. 2012-107672, dated Jun. 9, 2015.
Office Action from U.S. Appl. No. 11/078,265, dated Apr. 1, 2015.
Office Action from U.S. Appl. No. 10/958,945, dated May 1, 2015.
Office Action from Japanese Patent Appl. No. 2014-126655, dated Jan. 26, 2016.
Correction of deficiencies from European Patent Appl. No. 14734340.4, dated Jan. 27, 2016.
Correction of deficiencies from European Patent Appl. No. 14727697.6, dated Jan. 20, 2016.
Examination Report from European Patent appl. No. 12 171 403.4-1552, dated Jan. 21, 2016.
Office Action from U.S. Appl. No. 13/913,490; Nov. 25, 2015.
Office Action from U.S. Appl. No. 14/025,478; Dec. 4, 2015.
Office Action from U.S. Appl. No. 11/078,265; Dec. 9, 2015.
Office Action from U.S. Appl. No. 10/958,945; Jan. 6, 2016.
Office Action from U.S. Appl. No. 13/929,487; Feb. 5, 2016.
Examination Report from Taiwanese Patent Appl. No. 103119694, dated Oct. 19, 2015.

(56) References Cited

OTHER PUBLICATIONS

Examination Report from European Patent Appl. No. 12 171 401.8, dated Nov. 5, 2015.
Fifth Office Action and Search Report from Chinese Patent Appl. No. 201110265486.8, dated Dec. 3, 2015.
K. Asano, et al., "Novel High Power AlGaAs/GaAs Meet with a Field-Modulating Plate Operated at 35V Drain Voltage" ULSI Device Development Laboratories. NEC Corporation 9-1. Seiran 2-Chome. Otsu, Shiga 520-0833, Japan, 62-IEDM 98. pub. Date: Dec. 6, 1998.
Office Action from U.S. Appl. No. 10/958,945; Apr. 13, 2016.
Notice of Allowance for U.S. Appl. No. 2,564,955; Dated Feb. 29, 2016.
Notice of Allowance for U.S. Appl. No. 2,566,361; Dated Mar. 15, 2016.
Notice of Reasons for Rejection for Application No. 2015-145765; Dated Apr. 26, 2016.

\* cited by examiner

WIDE BANDGAP TRANSISTOR DEVICES WITH FIELD PLATES

This application is a continuation of and claims the benefit of U.S. patent application Ser. No. 12/321,493, filed on 21 Jan. 2009, now U.S. Pat. No. 8,120,064 which is a continuation of and claims the benefit of U.S. patent application Ser. No. 10/930,160, filed on 31 Aug. 2004, now U.S. Pat. No. 7,501,669 which claims the benefit of provisional application Ser. No. 60/501,576, filed on 9 Sep. 2003.

BACKGROUND OF THE INVENTION

1. Field of the Invention

The present invention relates to transistors and particularly to transistors utilizing field plates.

2. Description of the Related Art

High electron mobility transistors (HEMTs) are a common type of solid state transistor that are regularly fabricated from semiconductor materials such as Silicon (Si) or Gallium Arsenide (GaAs). One disadvantage of Si is that it has low electron mobility (600-1450 $cm^2/V$-s), which produces a high source resistance. This resistance can degrade the Si based HEMT's high performance gain. [CRC Press, *The Electrical Engineering Handbook*, Second Edition, Dorf, p. 994, (1997)]

GaAs based HEMTs have become the standard for signal amplification in civil and military radar, handset cellular, and satellite communications. GaAs has a higher electron mobility (approximately 6000 $cm^2/V$-s) and a lower source resistance than Si, which allows GaAs based devices to function at higher frequencies. However, GaAs has a relatively small bandgap (1.42 eV at room temperature) and relatively small breakdown voltage, which prevents GaAs based HEMTs from providing high power at high frequencies.

Improvements in the manufacturing of wide bandgap semiconductor materials such as AlGaN/GaN, has focused interest on the development of AlGaN/GaN HEMTs for high frequency, high temperature and high power applications. AlGaN/GaN has large bandgaps, as well as high peak and saturation electron velocity values [B. Belmont, K. Kim and M. Shur, *J. Appl. Phys.* 74, 1818 (1993)]. AlGaN/GaN HEMTs can also have two dimensional electron gas (2DEG) sheet densities in excess of $10^{13}/cm^2$ and relatively high electron mobility (up to 2019 $cm^2/Vs$) [R. Gaska, J. W. Yang, A. Osinsky, Q. Chen, M. A. Khan, A. O. Orlov, G. L. Snider and M. S. Shur, *Appl. Phys. Lett.*, 72, 707 (1998)]. These characteristics allow AlGaN/GaN HEMTs to provide very high voltage and high power operation at RF, microwave and millimeter wave frequencies.

AlGaN/GaN HEMTs have been grown on sapphire substrates and have shown a power density of 4.6 W/mm and a total power of 7.6 W [Y. F. Wu et al., *IEICE Trans. Electron.*, E-82-C, 1895 (1999)]. More recently, AlGaN/GaN HEMTs grown on SiC have shown a power density of 9.8 W/mm at 8 GHz [Y. F. Wu, D. Kapolnek, J. P. Ibbetson, P. Parikh, B. P. Keller and U. K. Mishra, *IEEE Trans. Electron. Dev.*, 48, 586 (2001)] and a total output power of 22.9 at 9 GHz [M. Micovic, A Kurdoghlian, P. Janke, P. Hashimoto, D. W. S. Wong, J. S. Moon, L. McCray and C. Nguyen, *IEEE Trans. Electron. Dev.*, 48, 591 (2001)].

U.S. Pat. No. 5,192,987 to Khan et al. discloses GaN/AlGaN based HEMTs grown on a buffer and a substrate. Other AlGaN/GaN HEMTs and field effect transistors (FETs) have been described by Gaska et al., "High-Temperature Performance of AlGaN/GaN HFET's on SiC Substrates," *IEEE Electron Device Letters*, Vol. 18, No 10, October 1997, Page 492; and Ping et al., "DC and Microwave Performance of High Current AlGaN Heterostructure Field Effect Transistors Grown on P-type SiC Substrates," *IEEE Electron Devices Letters*, Vol. 19, No. 2, February 1998, Page 54. Some of these devices have shown a gain-bandwidth product ($f_T$) as high as 67 gigahertz [K. Chu et al. WOCSEMMAD, Monterey, Calif. (February 1998)] and high power densities up to 2.84 W/mm at 10 GHz [G. Sullivan et al., "High Power 10-GHz Operation of AlGaN HFET's in Insulating SiC," *IEEE Electron Device Letters*, Vol. 19, No. 6, Page 198 (June 1998); and Wu et al., IEEE Electron Device Letters, Volume 19, No. 2, Page 50 (February 1998)].

Electron trapping and the resulting difference between DC and RF characteristics have been a limiting factor in the performance of GaN based transistors, such as AlGaN/GaN HEMTs. Silicon Nitride (SiN) passivation has been successfully employed to alleviate this trapping problem, which has resulted in high performance devices with power densities over 10 W/mm at 10 Ghz. U.S. Pat. No. 6,586,781 discloses methods and structures for reducing the trapping effect in GaN-based transistors. However, due to the high electric fields existing in these structures, charge trapping can still be an issue.

SUMMARY OF THE INVENTION

The present invention provides improved transistor structures utilizing gate connected field plates to improve operating characteristics. One transistor according to the present invention comprises a plurality of active semiconductor layers formed on a substrate. A source contact is formed in electrical contact with the plurality of active layers, and a drain contact is also formed in electrical contact with the plurality of active layers with space between the source and drain contacts on the topmost of the plurality of active layers. A gate is formed in electrical contact with the topmost of the plurality of active layers, between the source and drain contacts. A spacer layer of epitaxial material is formed on the surface of the topmost of the plurality of active layers, between the gate and the drain contact, wherein the gate is not covered by the spacer layer. A field plate is formed on the spacer layer integral to the gate.

Another embodiment of a transistor according to the present invention comprises a plurality of active semiconductor layers formed on a substrate. A source contact is formed in electrical contact with the plurality of active layers. A drain contact is also formed in electrical contact with the plurality of active layers with space between the source and drain contacts on the topmost of the plurality of active layers. A gate is formed in electrical contact with the topmost of the plurality of active layers, between the source and drain contacts. A spacer layer is formed on the surface of the topmost of the plurality of active layers, between the gate and the drain contact, and covering the gate contact. A field plate is formed on the spacer layer and is electrically connected to the gate.

Another embodiment of a transistor according to the present invention comprises a plurality of active semiconductor layers formed on a substrate. Source and drain contacts are formed in electrical contact with the plurality of active layers. A gate is formed in electrical contact with the topmost of the plurality of active layers, between the source and drain contacts. A first spacer layer formed on the surface of the topmost of the plurality of active layers, between the gate and the drain contact, wherein the gate is not covered by the spacer layer. A first field plate formed on the spacer layer integral to the gate and extending toward the drain contact on the spacer layer. A second spacer layer covering the field plate and the surface of the spacer layer between the field plate and drain contact, and further comprising a second field plate on the second spacer layer and extending from the edge of the gate toward the drain contact.

These and other further features and advantages of the invention would be apparent to those skilled in the art from the following detailed description, taking together with the accompanying drawings, in which:

DETAILED DESCRIPTION OF THE INVENTION

Figure 1:
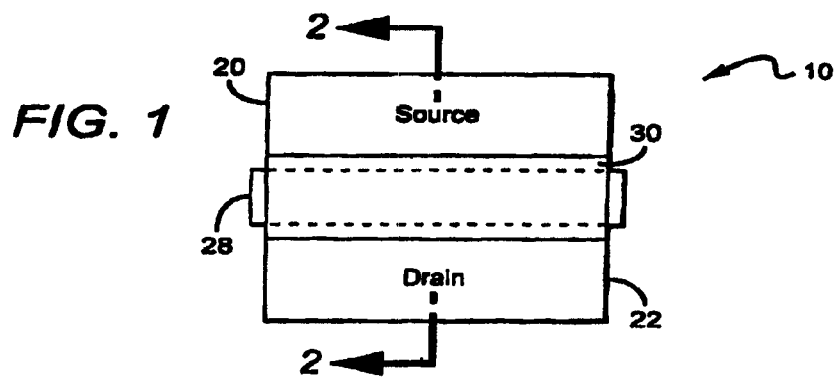
FIG. 1 is a plan view of one embodiment of a HEMT according to the present invention.

The field plate arrangements according to the present invention can be used with many different transistor structures. Wide bandgap transistor structures generally include an active region, with metal source and drain contacts formed in electrical contact with the active region, and a gate contact formed between the source and drain contacts for modulating electric fields within the active region. A spacer layer is formed above the active region. The spacer layer can comprise a dielectric layer, a layer of epitaxial material such as an undoped or depleted wide bandgap epitaxial material, or a combination thereof. A conductive field plate is formed above the spacer layer and extends a distance $L_f$ from the edge of the gate contact toward the drain contact. The field plate can be electrically connected to the gate contact. This field plate arrangement can reduce the peak electric field in the device, resulting in increased breakdown voltage and reduced trapping. The reduction of the electric field can also yield other benefits such as reduced leakage currents and enhanced reliability.

One type of transistor that can utilize the field plate arrangement according to the present invention is a high electron mobility transistor (HEMT), which typically includes a buffer layer and a barrier layer on the buffer layer. A two dimensional electron gas (2DEG) layer/channel is formed at the junction between the buffer layer and the barrier layer. A gate contact is formed on the barrier layer between the source and drain contacts and according to the present invention, a spacer layer is formed on the barrier layer at least between the gate and drain contact. It can also cover the barrier layer between the gate and source contact. The spacer layer can be formed before or after formation of the gate contact. The spacer layer can comprise a dielectric layer, a layer of undoped or depleted material Group III nitride material, or a combination thereof. Different Group III elements can be used in the spacer layer such as alloys of Al, Ga, or In, with a suitable spacer layer material being $Al_xGa_{1-x}N$ ($0 \leq x \leq 1$). A conductive field plate is formed above the spacer layer and extends a distance $L_f$ from the edge of the gate towards the drain contact. In some embodiments, the field plate is formed during the same deposition step as an extension of the gate contact. In other embodiments, the field plate and gate electrode are formed during separate deposition steps. The field plate can be electrically connected to the gate contact. In still other embodiments the field plate can be connected to the source contact.

Another type of transistor that can utilize a field plate arrangement according to the present invention is a metal semiconductor field effect transistor (MESFET), which typically comprises a buffer layer on a substrate and a channel layer on the buffer layer with the buffer layer between the substrate and channel layer. A source contact is included in ohmic contact with the channel layer and a drain contact is also included in ohmic contact with the channel layer. A space on the channel layer remains between the source and drain contacts with a gate included on the channel layer between the source and drain contacts. A spacer layer is included on the channel layer at least between the gate and drain contact. The spacer layer can also cover the space between the gate and source contact. A field plate is included on the spacer layer and in electrical contact with the gate.

This field plate arrangement for both the HEMT and MESFET can reduce the peak electric field in the device, compared to a device without a field plate, which can result in increased breakdown voltage and reduced trapping. The reduction of the electric field can also yield other benefits such as reduced leakage currents and enhanced reliability.

Figure 2:
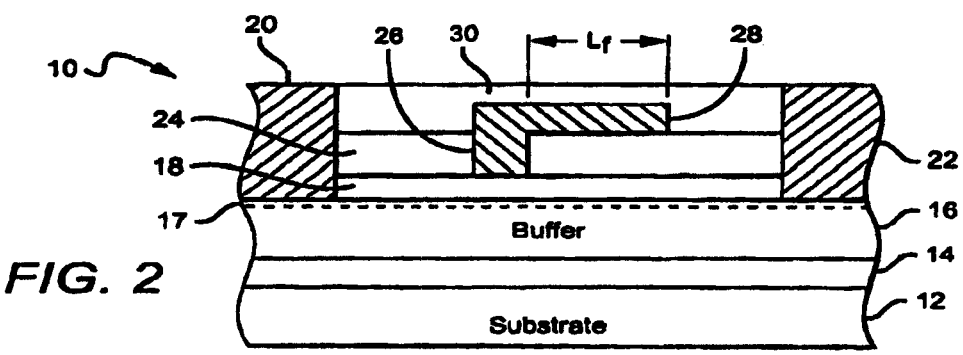
FIG. 2 is a sectional view of the HEMT in FIG. 1.

FIGS. 1 and 2 show one embodiment of a nitride based HEMT 10 according to the present invention that comprises a substrate 12 which can be made of silicon carbide, sapphire, spinet, ZnO, silicon, gallium nitride, aluminum nitride, or any other material capable of supporting growth of a Group-III nitride material. In some embodiments, the substrate 12 can comprise semi-insulating 4H—SiC commercially available from Cree, Inc. of Durham, N.C.

A nucleation layer 14 can be formed on the substrate 12 to reduce the lattice mismatch between the substrate 12 and the next layer in the HEMT 10. The nucleation layer 14 should be approximately 1000 angstroms (Å) thick, although other thicknesses can be used. The nucleation layer 14 can comprise many different materials, with a suitable material being $Al_zGa_{1-z}N$ ($0 \leq z \leq 1$). In one embodiment according to the present invention the nucleation layer comprises AlN ($Al_zGa_{1-z}N$, z=1). Nucleation layer 14 can be formed on the substrate 12 using known semiconductor growth techniques such as metal organic chemical vapor deposition (MOCVD), high vapor pressure epitaxy (HVPE) or molecular beam epitaxy (MBE). In still other embodiments, the nucleation layer can be formed as part of another layer in the HEMT 10, such as the buffer layer (described in detail below).

The formation of a nucleation layer 14 can depend on the material used for the substrate 12. For example, methods of forming a nucleation layer 14 on various substrates are taught in U.S. Pat. Nos. 5,290,393 and 5,686,738, each of which are incorporated by reference as if fully set forth herein. Methods of forming nucleation layers on silicon carbide substrates are disclosed in U.S. Pat. Nos. 5,393,993, 5,523,589, and 5,739,554 each of which is incorporated herein by reference as if fully set forth herein.

The HEMT 10 further comprises a high resistivity buffer layer 16 formed on the nucleation layer 14, with a suitable buffer layer 16 made of a Group III-nitride material such as $Al_xGa_yIn_{(1-x-y)}N$ ($0<=x<=1$, $0<=y<=1$, $x+y<=1$). In another embodiment according to the present invention the buffer layer 16 comprises a GaN layer that is approximately 2 µm thick, with part of the layer doped with Fe.

A barrier layer 18 is formed on the buffer layer 16 such that the buffer layer 16 is sandwiched between the barrier layer 18 and the nucleation layer 14. Each of the buffer layer 16 and barrier layer 18 can comprise doped or undoped layers of Group III-nitride materials. The barrier layer 18 can comprise one of more layers of different materials such as InGaN, AlGaN, AlN, or combinations thereof. In one embodiment the barrier layer 18 comprises 0.8 nm of AlN and 22.5 nm of $Al_xGa_{1-x}N$ ($x\approx0.195$, as measured by photo luminescence). Exemplary structures are illustrated in U.S. Pat. Nos. 6,316,793, 6,586,781, 6,548,333 and U.S. Published Patent Application Nos. 2002/0167023 and 2003/00020092 each of which is incorporated by reference as though fully set forth herein. Other nitride based HEMT structures are illustrated in U.S. Pat. Nos. 5,192,987 and 5,296,395 each of which is incorporated herein by reference as if fully set forth herein. The buffer and barrier layers 16, 18 can be made using the same methods used to grow the nucleation layer 14. A two dimensional electron gas (2DEG) layer/channel 17 is formed at the heterointerface between the buffer and barrier layer 16, 18. Electric isolation between the devices is done with mesa etch or ion implementation outside the active HEMT.

Metal source and drain contacts 20, 22 are formed making ohmic contact through the barrier layer 18. A spacer layer 24 can be formed on the surface of the barrier layer 18 between the source and drain contacts 20, 22. The spacer layer 24 can comprise a layer of non-conducting material such as a dielectric (SiN or SiO), or a number of different layers of non-conducting materials such as different dielectrics. In alternative embodiments the spacer layer can comprise one or more layers of epitaxial material alone or in combination with layers of dielectric material. The spacer layer can be many different thicknesses, with a suitable range of thicknesses being approximately 0.05 to 0.5 microns. The spacer layer 24 is primarily arranged to allow a field plate to be deposited on it, with the field plate extending from the gate 26 toward the drain contact 22. Accordingly, in some embodiments according to the present invention the spacer layer 24 can be included only on the surface of the barrier layer 18 between the gate 26 and drain contact 22.

In embodiments where the spacer layer 24 covers the barrier layer 18 between the source and drain contacts 20, 22, the spacer layer 24 can be etched to the barrier layer 18 and a gate electrode 26 deposited such that the bottom of the gate electrode 26 is on the surface of barrier layer 18. In embodiments where the spacer layer 24 only covers a portion of the barrier layer 18, the gate 26 can be deposited on the barrier layer 18 adjacent to the spacer layer 24. In still other embodiments, the gate 26 can be deposited before the spacer layer 24.

A field plate 28 can be formed integral to the gate by the metal forming the gate electrode being patterned to extend across spacer layer 24 so that the top of the gate 26 forms a field plate structure 28 extending a distance $L_f$ away from the edge of gate 26 towards drain 22. Stated differently, the part of the gate metal resting on the spacer layer 24 forms a field plate 28. The structure can then be covered with a dielectric passivation layer 30 such as silicon nitride. Methods of forming the dielectric passivation 30 are described in detail in the patents and publications referenced above.

Electric current can flow between the source and drain contacts 20, 22 through the 2DEG layer/channel 17 when the gate 26 is biased at the appropriate level. The source and drain contacts 20, 22 can be made of different materials including but not limited to alloys of titanium, aluminum, gold or nickel. The gate 26 can also be made of different materials including but not limited to gold, nickel, platinum, palladium, iridium, titanium, chromium, alloys of titanium and tungsten, or platinum silicide. The gate 26 can have many different lengths, with a suitable range of gate lengths being 0.01 to 2 microns. In one embodiment according to the present invention a preferred gate length ($L_g$) is approximately 0.5 microns. In some embodiments, the field plate 28 is formed during the same deposition step as an extension of the gate 26. In other embodiments, the field plate 28 and gate 26 are formed during separate deposition steps. The formation of source and drain contacts 20, 22 is described in detail in the patents and publications referenced above.

The field plate 28 can extend different distances $L_f$ over the barrier layer from the edge of the gate 26 with a suitable range of distances being 0.1 to 1.5 µm, although other distances can also be used. The field plate 28 can comprise many different conductive materials with a suitable material being a metal, such as the same metal used for the gate 26. The gate 26 and field plate 28 can be deposited using standard metallization methods.

Figure 3:
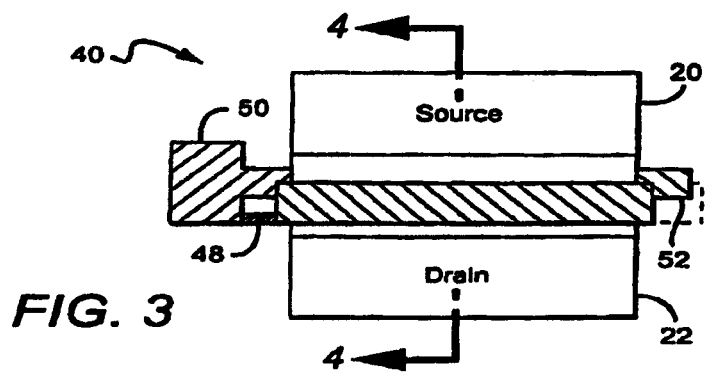
FIG. 3 is a plan view of another embodiment of a HEMT according to the present invention.
Figure 4:
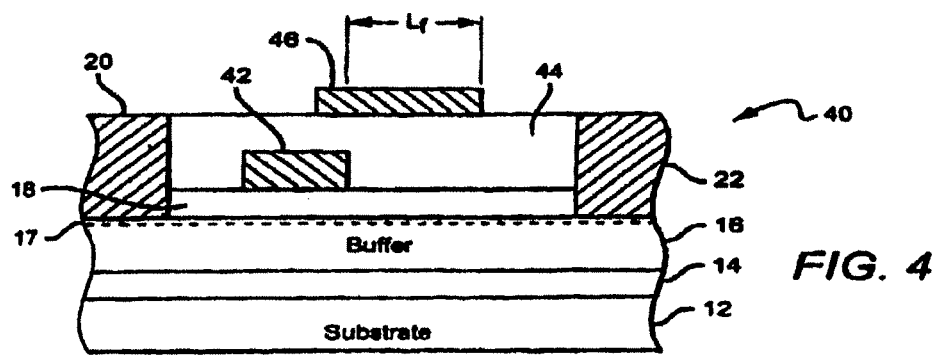
FIG. 4 is a sectional view of the HEMT in FIG. 3.

FIGS. 3 and 4 show another embodiment of a HEMT 40 according to the present invention that is similar to the HEMT 10 in FIGS. 1 and 2. For the same or similar features for the HEMT 40 in FIGS. 3 and 4, and the figures that follow, the same reference numerals from FIGS. 1 and 2 will be used. The HEMT 40 comprises a substrate 12, nucleation layer 14, buffer layer 16, 2DEG 17, barrier layer 18, source contact 20, and drain contact 22. A gate 42 is formed after formation of the barrier layer 18. A spacer/passivation layer 44 is formed on the device and particularly over the gate 42 and the surface of the barrier layer 18 between the gate 42 and the source and drain contacts 20, 22. In other embodiments the spacer/passivation layer can be included only over the gate 42 and the surface of the barrier layer 18 between the gate 42 and the drain contact 22. A field plate 46 is then formed on the spacer/passivation layer 44 overlapping the gate 42 and extending a distance $L_f$ in the gate-drain region. In the embodiment shown in FIGS. 3 and 4, the spacer/passivation layer 44 serves as a spacer layer for the field plate 46. The overlap of the field plate 46 over the gate 42 and the distance $L_f$ can be varied for optimum results.

The field plate 46 can be electrically connected to gate 42 and FIG. 3 shows two alternative gate connection structures that can be used, although it is understood that other connection structures can also be used. The field plate 46 can be connected to the gate 42 through a first conductive path 48 running outside the active area of the HEMT 40 to a gate contact 50 that is used to make electrical contact to the gate 42. A second conductive path 52 (shown in phantom) can also be used that runs outside of the active region of the HEMT 40 on the side opposite the gate contact 50. The conductive path 52 is coupled between the gate 42 and the field plate 46. Conductive vias (not shown) can also be used to connect the field plate 46 to the gate 42, with each vias running between the two through the passivation layer 44. The vias can be arranged periodically down the field plate 46 to provide for effective current spreading from the gate 42 to the field plate 46.

As in HEMT 10 in FIGS. 1 and 2, the field plate 46 can extend different distances $L_f$ over the barrier layer from the edge of the gate 42, with a suitable range of distances being 0.1 to 1.5 μm, although other distances can also be used. In some embodiments, the field plate 46 can extend a distance $L_f$ of 0.2 to 1 μm. In other embodiments, the field plate 46 can extend a distance $L_f$ of 0.5 to 0.9 μm. In preferred embodiments, the field plate 46 can extend a distance $L_f$ of approximately 0.7 μm.

Figure 5:
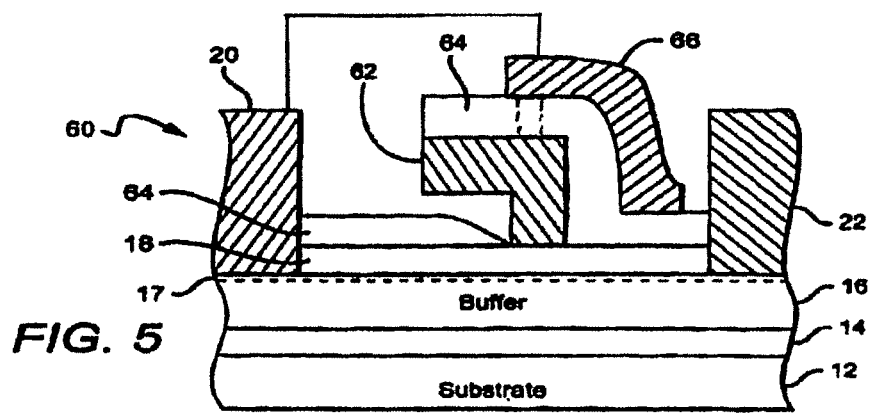
FIG. 5 is a sectional view of another embodiment of a HEMT according to the present invention having a gamma shaped gate.

FIG. 5 shows another embodiment of a HEMT 60 according to the present invention that has many features similar to those in HEMTs 10 and 40, including a substrate 12, nucleation Layer 14, buffer layer 16, 2DEG 17, barrier layer 18, source contact 20, and drain contact 22. HEMT 60, however, has a gamma (Γ) shaped gate 62 that is particularly adapted to high frequency operation. The gate length is one of the important device dimensions in determining the speed of the device, and with higher frequency devices the gate length is shorter. Shorter gate contacts lead to high resistance that can negatively impact high frequency operation. T-gates are commonly used in high frequency operation, but it can be difficult to achieve a well-coupled placement of a field plate with a T-gate.

The gamma gate 62 provides for low gate resistance and allows for controlled definition of the gate footprint. A spacer/passivation layer 64 is included that covers the gamma gate 62 and the surface of barrier layer 18 between the gamma gate 62 and the source and drain contacts 20, 22. A space can remain between the horizontal portion of the gamma gate 62 and the top of the spacer layer. The HEMT 60 also includes a field plate 66 on the spacer layer 64 that overlaps that gamma gate 62, with the field plate 66 preferably deposited on the side of the gamma gate not having a horizontal overhanging section. This arrangement allows for tight placement and effective coupling between the field plate and the active layers below it.

Like the field plate 46 shown in FIGS. 3 and 4 and described above, the field plate 66 can be electrically connected to the gate 62 in many different ways. A first conductive path (not shown) can be included between the field plate 66 and the gate contact or a second conductive path (not shown) can be included between field plate 66 and the gate 62, with both the conductive paths being outside the active area of the HEMT. Conductive vias, such as the one depicted by the dashed lines through spacer/passivation layer 64, can also be used between the field plate 66 and gate 62 that pass through the spacer layer 64. Alternatively or in addition to the gate connected field plate arrangement, one or more field plates can be electrically connected to the source 20 as shown.

Figure 6:
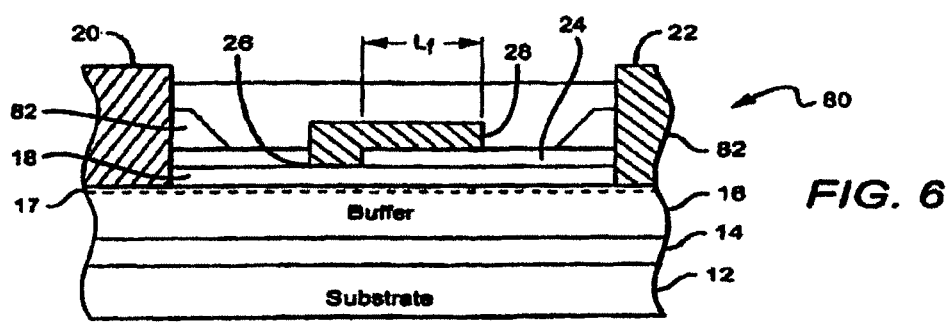
FIG. 6 is a sectional view of another embodiment of a HEMT according to the present invention having an n+ doped contact layer.

FIG. 6 shows another embodiment of a HEMT 80 according to the present invention that is similar to HEMT 10 shown in FIG. 1, and also comprises a substrate 12, nucleation layer 14, buffer layer 16, 2DEG 17, barrier layer 18, source contact 20, drain contact 22, spacer layer 24, and gate 26 with a field plate structure 28. The HEMT 80 also includes a doped $n^+$ contact layer 82 formed on the spacer layer 24. Prior to formation of gate contact 26, contact layer 82 is etched to reveal a portion of the surface of spacer layer 24. A smaller portion of the spacer layer 24 can then be etched down to the barrier layer 18. The contact layer 82, spacer layer 24 and barrier layer can also be etched down to the buffer layer 16 so that source and drain contacts 20, 22 can be deposited. Contact layer 82 facilitates formation of ohmic source and drain contacts 20, 22 as well as providing low access region resistances.

Figure 7:
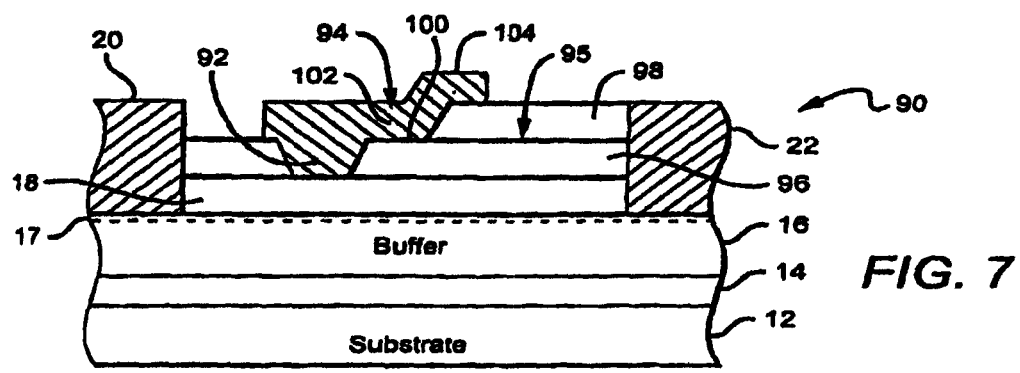
FIG. 7 is a sectional view of another embodiment of a HEMT according to the present invention having multiple spacer layers.

FIG. 7 shows another embodiment of a HEMT 90 according to the present invention having a substrate 12, nucleation layer 14, buffer layer 16, 2DEG 17, barrier layer 18, source contact 20 and drain contact 22 similar to those in the HEMTs described above. The HEMT 90 also comprises a gate 92 and a field plate 94. Instead of having a spacer layer, however, the HEMT 90 comprises multiple spacer layers 95, in this case two, although it is understood that more spacer layers can be used. A first spacer layer 96 is formed on the barrier layer 18 at least between the gate 92 and the drain contact 22, with a preferred spacer layer also on the barrier layer 18 between the gate 92 and source contact 20. A second spacer layer 98 is formed on the first spacer layer 96 and can be arranged in many different ways. It preferably covers less than all of the top surface of the first spacer layer 96 to form a step 100. The field plate 94 is formed on the spacer layers, and because of the step 100, the field plate 94 essentially comprises first and second field plates portions 102, 104 each of which has a different spacing between it and the barrier layer 18.

The first and second spacer layers 96, 98 can comprise many different materials, with the layers typically comprising epitaxial materials or dielectric materials, such as SiN and SiO. In one embodiment according to the present invention, the first spacer layer 96 can be an epitaxial material and the second spacer layer 98 can be a dielectric material. In another embodiment the first spacer layer 96 can again be an epitaxial material, and the second spacer layer 98 can also be an epitaxial material of the same or different material as the first spacer layer 96. It may also be possible to have the first spacer layer 96 comprise a dielectric material and the second spacer layer 98 comprise an epitaxial layer, although depending on the type of dielectric material used it can be difficult to form the second (epitaxial) layer 98 because of crystal structure loss. Better field plate coupling is typically provided using an epitaxial material, but the capacitance introduced by an epitaxial material can be higher than that of a dielectric material.

By having first and second field plates 102, 104, the HEMT 90 can exhibit its improved operating characteristics at two different voltages, with the first field plate 102 allowing improved operation of the HEMT 90 at one voltage and the second field plate 104 allowing improved operation at a higher second voltage. For example, in embodiments of the HEMT 90 wherein the first spacer layer 102 is epitaxial (typically AlGaN or similar material), the physical dimensions and dielectric constant of the layer 102 under the first field plate 102 is the same. The consistent dimensions and dielectric constant allow for the first field plate to provide improved HEMT 90 operating characteristics at a first voltage.

If the second layer 98 is made of a dielectric material it generally has a lower dielectric constant than the epitaxial material in the first layer 96. As a result, the overall dielectric constant of the material under the second field plate 104 will be lower than the dielectric constant of the material under the first field plate 102. This results in lower capacitance and reduced coupling. The greater distance between the second field plate 104 and the barrier layer 18 along with the lowered dielectric constant results in the second field plate 104 providing improved operating characteristics at a higher voltage.

In those embodiments of the HEMT 90 where the first and second layers 96, 98 are epitaxial, the dielectric constant below the first and second field plates 102, 104 remains the same, but the increased distance between the second field plate 104 and barrier layer 18 still provides improved operating characteristics at a higher voltage. The higher operating voltage, however, is typically different than it would be if the second spacer layer were a dielectric material.

The gate 92, field plate 102, 104, and spacer layers 94, 96 can be formed in many different ways, with one formation method being depositing the first (epitaxial) spacer layer 94 on the barrier layer 18 and then etching the barrier layer to provide a space for the gate 92. The gate 92 can then be deposited and the second spacer layer 96 can be deposited on the first 96. In other embodiments the second spacer layer 96 can be etched before deposition of the gate 92. Alternatively, the first and second spacer layers 96, 98 can be deposited on then etched in two etch steps; the first etch through both the layers 96, 98 and the second through the second layer 98 to form the step 100. The gate 92 can then be deposited and the field plates 102, 104 can then be deposited over the first spacer and second spacer layers 96, 98. Alternatively, the first and second spacer layers 96, 98 can be formed and then etched with the gate 92 and field plates formed in one or more formation steps. In still other embodiments a single spacer layer of epitaxial or dielectric material can be etched to provide a step such that the resulting field plate has first and second portions.

Figure 8:
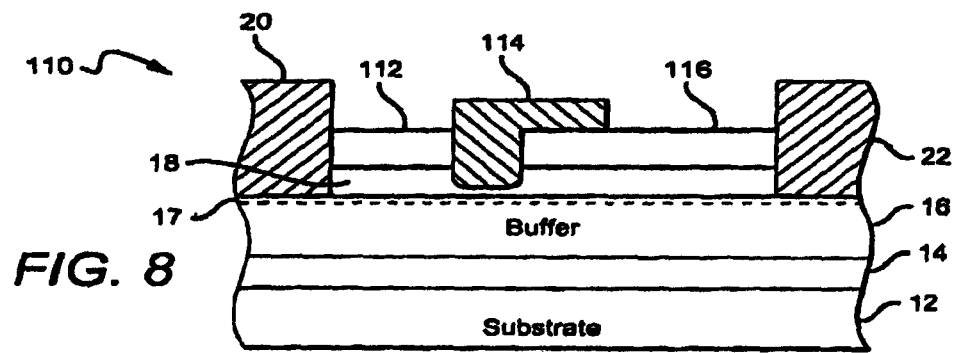
FIG. 8 is a sectional view of another embodiment of a HEMT according to the present invention having a recessed gate.
Figure 9:
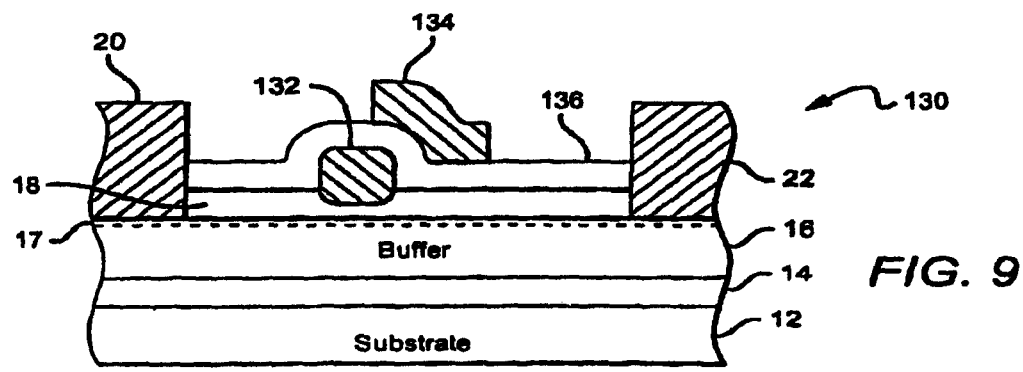
FIG. 9 is a sectional view of another embodiment of a HEMT according to the present invention having a recessed gate.
Figure 10:
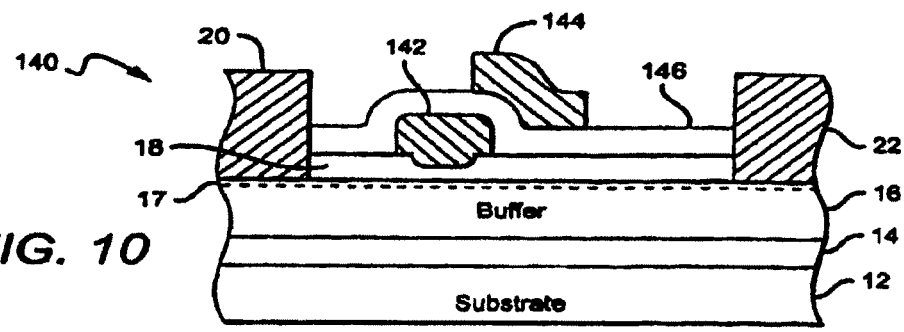
FIG. 10 is a sectional view of another embodiment of a HEMT according to the present invention having a recessed gate.

The gate and field plate structures according to the present invention can be used in many different ways beyond those shown in FIGS. 1-7 above. FIGS. 8, 9 and 10 show HEMTs 110, 130 and 140, respectively, with each HEMT having a substrate 12, nucleation layer 14, buffer layer 16, 2DEG 17, barrier layer 18, source contact 20 and drain contact 22 similar to those in the HEMTs described above. The HEMT 110 (FIG. 8) is similar to the HEMT 10 in FIGS. 1 and 2 except that its gate 112 is recessed in the barrier layer 18. The HEMT's field plate 114 is deposited on a spacer layer 116 and extend from the gate 112 toward the drain contact 22. The field plate 114 provides the same operating improvements as the field plate 28 in HEMT 10. HEMT 130 (FIG. 9) is similar to HEMT 40 in FIGS. 3 and 4 except that the gate 132 is recessed. The field plate 134 is deposited on a spacer layer 136 and provides the same operating benefits. The HEMTs described herein can also comprise gates that are only partially recessed. The HEMT 140 is similar to the HEMT 130 except that its gate 142 is partially recessed. Its field plate 144 is deposited on a spacer layer 146 and provides the same operating benefits.

Figure 11:
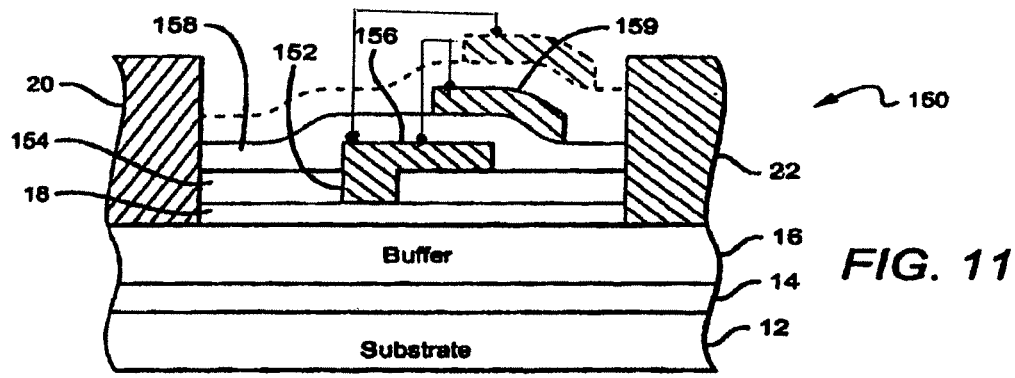
FIG. 11 is a sectional view of another embodiment of a HEMT according to the present invention having multiple field plates.

FIG. 11 shows still another embodiment of a HEMT 150 according to the present invention having a substrate 12, nucleation layer 14, buffer layer 16, 2DEG 17, barrier layer 18, source contact 20 and drain contact 22. The HEMT 150 also has a gate 152, spacer layer 154, and integral field plate 156. The HEMT 150 further comprises a second spacer layer 158 covering the field plate 156, spacer layer 154 and portion of the gate 152 above the spacer layer 154. A second field plate 159 is on the second spacer layer 158 extending generally from the gate 152 toward the drain 22, with the second field plate electrically coupled to the gate either by one or more vias (not shown) through the second spacer layer 158, or by one or more conductive paths (as depicted) formed outside of the active region of the HEMT 150. Other HEMTs according to the present invention can comprise additional spacer layer and field plate pairs, with one additional pair shown in phantom. The structure can also be covered by a dielectric passivation layer (not shown).

Figure 12:
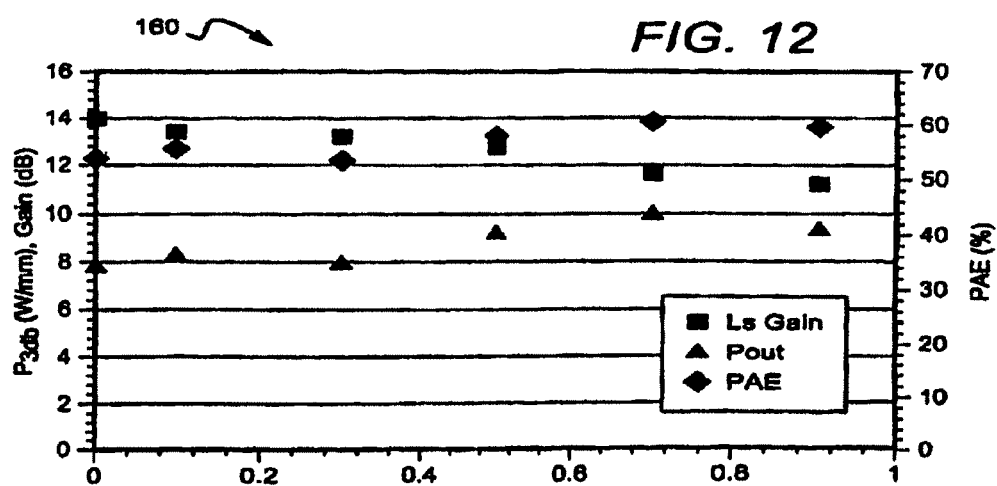
FIG. 12 is a graph showing the performance of certain HEMTs arranged according to the present invention.

A GaN-based HEMT structure in accordance with the embodiment of FIGS. 3 and 4 was constructed and tested, with the results of the testing shown in the graph 160 of FIG. 12. Initial testing showed a power density of 20.4 W/mm with 51% Power Added Efficiency (PAE) operating in class B at 82V and 4 GHz. More recent testing has achieved improved performance with a power density of 32 W/mm with 55% PAE at 120V and 4 Ghz.

The effect of field plate distance ($L_f$) on device performance was tested. The field plate length $L_f$ was varied from a distance of 0 to 0.9 μm and the PAE of the resulting devices was then measured. As illustrated in FIG. 12, the PAE showed improvement once the field plate length was extended to 0.5 μm, with an optimum length of about 0.7 μm. However, the optimum length may depend on the specific device design as well as operating voltage and frequency.

Figure 13:
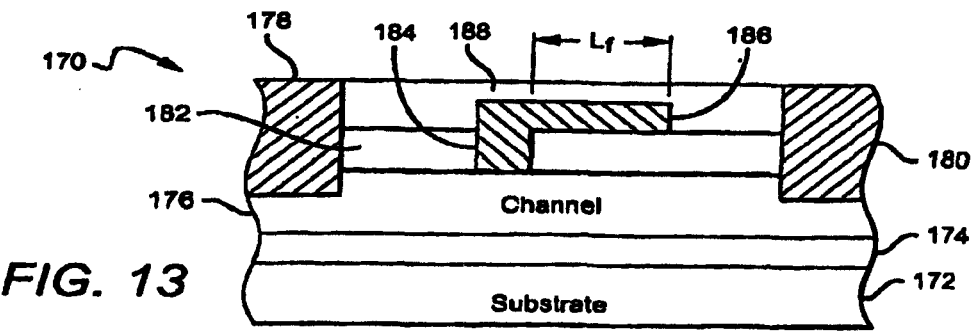
FIG. 13 is a sectional view of one embodiment of a MESFET according to the present invention.

The field plate arrangements described above can be used in other types of transistors. FIG. 13 shows one embodiment of a metal semiconductor field effect transistor (MESFET) 170 according to the present invention that is preferably silicon carbide (SiC) based, although MESFETs of other material systems can also be used. MESFET 170 comprises a silicon carbide substrate 172 on which a silicon carbide buffer 174 and a silicon carbide channel layer 176 are formed with the buffer 174 sandwiched between the channel layer 176 and substrate 172. Source and drain contacts 178, 180 are formed in contact with the channel layer 176.

A non-conducting spacer layer 182 is formed on the channel layer 176, between the source and drain contacts 178, 180. Similar to the spacer layer 24 described above and shown in FIGS. 1 and 2, the spacer layer 182 can comprise a layer of non-conducting material such as a dielectric, or a number of different layers of non-conducting materials such as different dielectrics or epitaxial materials.

Also similar to the spacer layer 24 in FIGS. 1 and 2, the spacer layer 182 can be etched to the channel layer 176 and a gate 184 can be deposited such that the bottom of the gate 184 is on the surface of channel layer 176. The metal forming the gate 184 can be patterned to extend across spacer layer 182 so that the top of the gate 184 forms a field plate structure 186 extending a distance $L_f$ away from the edge of gate 184 towards drain contact 180. Finally, the structure can be covered with a dielectric passivation layer 188, such as silicon nitride.

The fabrication of silicon carbide based MESFET devices is described in more detail in U.S. Pat. No. 5,686,737 and U.S. patent application Ser. No. 09/567,717 filed May 10, 2000 entitled "Silicon Carbide Metal-Semiconductor Field Effect Transistors and Methods of Fabricating Silicon Carbide Metal-Semiconductor Field Effect Transistors" each of which is incorporated herein by reference in its entirety.

Figure 14:
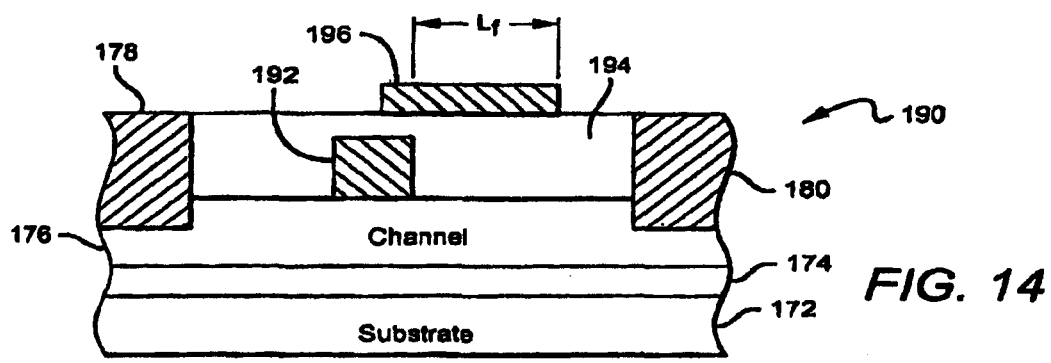
FIG. 14 is a sectional view of another embodiment of a MESFET according to the present invention.

FIG. 14 shows another embodiment of a MESFET 190 according to the present invention that is similar to MESFET 170 in FIG. 12, but has a gate and field plate structure similar to that in the HEMT 40 shown in FIGS. 3 and 4. MESFET 190 comprises a silicon carbide substrate 172, buffer 174, and channel 176. It also comprises a source contact 178, drain contact 180, and a gate 192 deposited on the channel 176. A spacer layer 194 is deposited over the gate 192 and on the surface of the channel 176 between the gate 192 and the source and drain contacts 178, 180. A field plate 186 is deposited on the spacer layer 194 and overlaps the gate 192. The field plate 196 is coupled to the gate 192 by a conductive path as described above in HEMT 40 of FIGS. 3 and 4. Many different conductive paths can be used including a first conductive path to the gate contact (not shown) or a second conductive path (not shown) to the gate 192, both of which run outside of the MESFET active area. The field 196 can also be coupled to the gate 192 by conductive vias (not shown) through the spacer layer 194.

Figure 15:
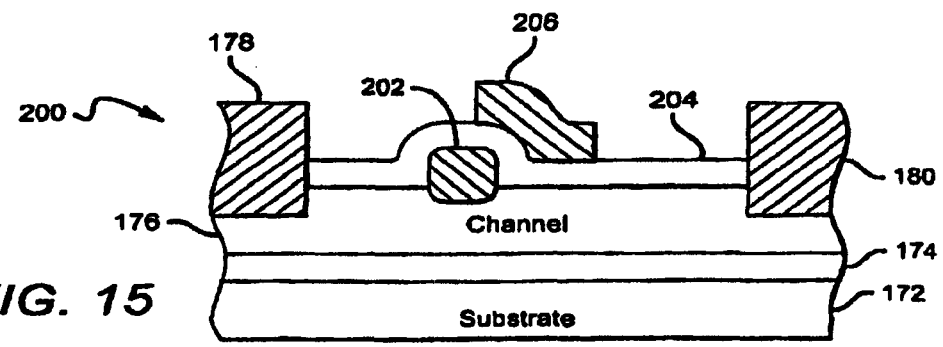
FIG. 15 is still another embodiment of a MESFET according to the present invention having a recessed gate.

Just as with the HEMTs above, different embodiments of MESFETs according to the present invention can comprise recessed gates. FIG. 15 shows one embodiment of a MESFET 200 according to the present invention, with a recessed gate 202. Similar to the MESFETs 170 and 190 shown in FIGS. 12 and 13, MESFET 200 also has a silicon carbide substrate 172, buffer 174, channel 176, a source contact 178 and a drain contact 180. The gate 202 deposited on the channel 176. A spacer layer 204 is deposited over the gate 202 on the surface of the channel 176 between the gate 202 and the source and drain contacts 178, 180. The spacer layer 204 is thinner than the spacer layer 194 in FIG. 14 such that it conforms more closely to the shape of the gate 202. The gate 202 is partially recessed in the channel 176 and a field plate 206 is deposited on the spacer layer 204, overlapping the gate 202. The field plate 206 is coupled to the gate 202 by one or more conductive paths such as those described in HEMT 40 in FIGS. 3 and 4.

It is also understood that different embodiments of MESFETs according to the present invention can comprise multiple spacer layers as described HEMT 90 of FIG. 7. In some embodiments according to the present invention, the MESFETs can have two spacer layers in a stepped arrangement, although more than two spacer layers can be used. The layers can comprise epitaxial or dielectric materials as also described above, with the stepped arrangement effectively providing two field plates that provide improved operating characteristics at two voltages. It is also understood that MESFETs according to the present invention can also comprise multiple spacer layers and field plates similar to those on the HEMT 150 shown in FIG. 11 and described above.

Although the present invention has been described in considerable detail with reference to certain preferred configurations thereof, other versions are possible. The field plate arrangement can be used in many different devices. The field plates can also have many different shapes and can be connected to the source contact in many different ways. Accordingly, the spirit and scope of the invention should not be limited to the preferred versions of the invention described above.

We claim:

1. A transistor, comprising:
a plurality of semiconductor layers;
a source contact in electrical contact with said plurality of semiconductor layers;
a drain contact also in electrical contact with said plurality of semiconductor layers with space between said source and drain contacts;
a gate in electrical contact with said plurality of semiconductor layers, between said source and drain contacts;
a first dielectric spacer layer on the surface of the topmost of said plurality of semiconductor layers, between said gate and said drain contact;
a first field plate on said first dielectric spacer layer and electrically connected to said gate, wherein said first field plate provides a reduction in the peak operational electric field;
a second spacer layer at least partially on said gate; and
a second field plate on said second spacer layer, wherein said second spacer layer separates said gate from said second field plate.

2. The transistor of claim 1, wherein said second field plate is electrically connected to said source.

3. The transistor of claim 1, wherein said first field plate at least partially overlaps said gate and extends on said first dielectric spacer layer toward said drain contact.

4. The transistor of claim 1, further comprising one or more conductive vias running between said gate and field plates through said first dielectric spacer layer, said vias providing said field plate electrical connection with said gate.

5. The transistor of claim 1, further comprising one or more conductive paths between said field plates and gate, each said path running outside of said first dielectric spacer layer and providing said field plate electrical connection with said gate.

6. The transistor of claim 1, comprising a high electron mobility transistor (HEMT) and wherein said plurality of semiconductor layers comprises at least a buffer layer on a substrate and a barrier layer on said buffer layer with a two dimensional electron gas between said buffer and barrier layer, said barrier layer being the topmost of said plurality of semiconductor layers.

7. The transistor of claim 6, wherein said HEMT is gallium nitride based.

8. The transistor of claim 6, further comprising a nucleation layer between said buffer layer and said substrate.

9. The transistor of claim 1, comprising a metal semiconductor field effect transistor (MESFET) wherein said plurality of active layers comprises at least a buffer layer on said substrate and a channel layer on said buffer layer, said channel layer being the topmost of said plurality of active layers.

10. The transistor of claim 9, wherein said MESFET is silicon carbide based.

11. The transistor of claim 1, wherein said gate is gamma shaped.

12. The transistor of claim 1, wherein said reduction in the peak operational electric field is compared to a transistor comprising a similar structure without said field plate.

13. The transistor of claim 1, wherein said gate is at least partially recessed in said topmost of said plurality of semiconductor layers.

14. The transistor of claim 1, further comprising a passivation layer covering at least some of the exposed surfaces of said transistor.

15. A transistor, comprising:
a Group-III nitride semiconductor layer;
metal source and drain contacts in electrical contact with said semiconductor layer;
a gate contact directly on said semiconductor layer between said source and drain contacts for modulating electric fields within said semiconductor layer;
a first dielectric spacer layer on said Group-III nitride semiconductor layer, between said gate and said drain contact;
a conductive field plate on said first dielectric spacer layer, said field plate extending a distance $L_f$ from the edge of said gate contact toward said drain contact, said field plate electrically connected to said gate or source contact and providing a reduction in the peak operational electric field in said transistor compared to a similar transistor without said field plate;
a second spacer layer at least partially on said gate; and
a second conductive field plate on said second spacer layer, wherein said second spacer layer separates said gate from said second conductive field plate.

16. A transistor, comprising:
a plurality of semiconductor layers;
a source and a drain contact in electrical contact with said plurality of semiconductor layers;
a gate in electrical contact with said plurality of semiconductor layers, between said source and drain contacts;

a first dielectric spacer layer on the surface of the topmost of said plurality of semiconductor layers, between said gate and said drain contact;

a first field plate on said first dielectric spacer layer integral to said gate and extending toward said drain contact on said first dielectric spacer layer;

a second spacer layer at least partially on said first field plate, said gate and the surface of said first dielectric spacer layer between said first field plate and drain contact, and further comprising a second field plate on said second spacer layer and extending from at least the edge of said gate toward said drain contact, said second spacer layer separates said gate from said second field plate.

17. The transistor of claim 16, wherein said first field plate is electrically connected to said gate.

18. The transistor of claim 16, further comprising at least one additional spacer layer and field plate pair over said second spacer layer and second field plate, wherein each field plate in said pairs is electrically connected to said gate.

19. A transistor, comprising:
a plurality of semiconductor layers;
a source and a drain contact in electrical contact with said plurality of semiconductor layers with space between said source and drain contacts on said plurality of semiconductor layers;
a gate in electrical contact with said plurality of semiconductor layers, between said source and drain contacts;
a first dielectric spacer layer on the surface of the topmost of said plurality of semiconductor layers, between said source and said drain contacts; and
a first field plate on said first dielectric spacer layer, wherein said transistor operates with a power density of greater than 20 W/mm;
a second spacer layer at least partially on said gate; and
a second field plate on said second spacer layer, wherein said second spacer layer separates said gate from said second field plate.

20. The transistor of claim 19, operating with a power added efficiency of greater than 50%.

21. The transistor of claim 19, operating at greater than 80V and approximately 4 Ghz.

22. The transistor of claim 19, operating with a power density of greater than 32 W/mm, with 55% power added efficiency.

23. The transistor of claim 22, operating at approximately 120V and approximately 4 Ghz.

24. The transistor of claim 19, wherein said first field plate provides a reduction in the peak operational electric field.

25. The transistor of claim 19, wherein said first field plate is electrically connected to said gate.

26. A transistor, comprising:
a plurality of semiconductor layers;
a source contact in electrical contact with said plurality of semiconductor layers;
a drain contact also in electrical contact with said plurality of semiconductor layers with space between said source and drain contacts on the topmost of said plurality of semiconductor layers;
a gate in electrical contact with said plurality of semiconductor layers, between said source and drain contacts;
a first dielectric spacer layer on the surface of the topmost of said plurality of semiconductor layers, between said source and said drain contacts;
a first field plate on said first dielectric spacer layer and electrically connected to said gate, wherein said first field plate extends on said first dielectric spacer layer, from the edge of said gate toward said drain, a distance of at least about 0.1 to 1.5 µm;
a second spacer layer at least partially on said gate; and
a second field plate on said second spacer layer, wherein said second spacer layer separates said gate from said second field plate.

27. The transistor of claim 26, wherein said first field plate extends on said first dielectric spacer layer from the edge of said gate a distance in the range of approximately 0.1 to 1.5 µm.

28. The transistor of claim 26, wherein said first field plate extends on said first dielectric spacer layer from the edge of said gate a distance in the range of approximately 0.2 to 1.0 µm.

29. The transistor of claim 26, wherein said first field plate extends on said first dielectric spacer layer from the edge of said gate a distance in the range of approximately 0.5 to 0.9 µm.

30. The transistor of claim 26, wherein said first field plate extends on said first dielectric spacer layer from the edge of said gate a distance of approximately 0.7 µm.

31. The transistor of claim 26, wherein the power added efficiency improves as the extension distance of said first field plate increases at least through a portion of said extension distance range.

* * * * *